US010542635B2

(12) United States Patent
Nishiyama

(10) Patent No.: US 10,542,635 B2
(45) Date of Patent: Jan. 21, 2020

(54) ELECTRONIC APPARATUS AND DUMMY DEVICE

(71) Applicant: FUJITSU LIMITED, Kawasaki-shi, Kanagawa (JP)

(72) Inventor: Takeshi Nishiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/393,999

(22) Filed: Apr. 25, 2019

(65) Prior Publication Data
US 2019/0364693 A1    Nov. 28, 2019

(30) Foreign Application Priority Data

May 22, 2018    (JP) .................................. 2018-098043

(51) Int. Cl.
*H05K 7/20*    (2006.01)

(52) U.S. Cl.
CPC ..... *H05K 7/20236* (2013.01); *H05K 7/20272* (2013.01); *H05K 7/203* (2013.01)

(58) Field of Classification Search
CPC . H05K 7/20236; H05K 7/20272; H05K 7/203
See application file for complete search history.

(56) References Cited

U.S. PATENT DOCUMENTS

| 5,559,678 A | * | 9/1996 | Fukuda | ................ | H05K 7/1425 |
| | | | | | 174/377 |
| 2010/0103614 A1 | * | 4/2010 | Campbell | .............. | H05K 7/203 |
| | | | | | 361/689 |
| 2011/0144825 A1 | * | 6/2011 | Yamasaki | ................. | G06F 1/20 |
| | | | | | 700/300 |
| 2014/0224456 A1 | * | 8/2014 | Takasu | ..................... | G06F 1/20 |
| | | | | | 165/104.33 |
| 2015/0060009 A1 | * | 3/2015 | Shelnutt | .................. | F28F 27/02 |
| | | | | | 165/11.1 |
| 2015/0233967 A1 | * | 8/2015 | Thordarson | ...... | G11C 29/56016 |
| | | | | | 324/750.14 |
| 2017/0265328 A1 | * | 9/2017 | Sasaki | ................ | H05K 7/20236 |
| 2017/0354061 A1 | | 12/2017 | Saito | | |
| 2019/0098799 A1 | * | 3/2019 | Richards | ............ | H05K 7/20863 |

FOREIGN PATENT DOCUMENTS

WO    2016/088280    6/2016

* cited by examiner

*Primary Examiner* — Jacob R Crum
(74) *Attorney, Agent, or Firm* — Fujitsu Patent Center

(57) ABSTRACT

An electronic apparatus includes a liquid immersion tank that stores a refrigerant and has a plurality of slots therein, an electronic device stored in one slot of the plurality of slots and a dummy device stored in another slot of the plurality of slots, formed in a hollow shape, the dummy device having a ceiling portion and a bottom portion, the ceiling portion having a first hole and an opening and closing portion to open and close the first hole, and the bottom portion being open, and a fixing portion that fixes the dummy device to the liquid immersion tank.

15 Claims, 21 Drawing Sheets

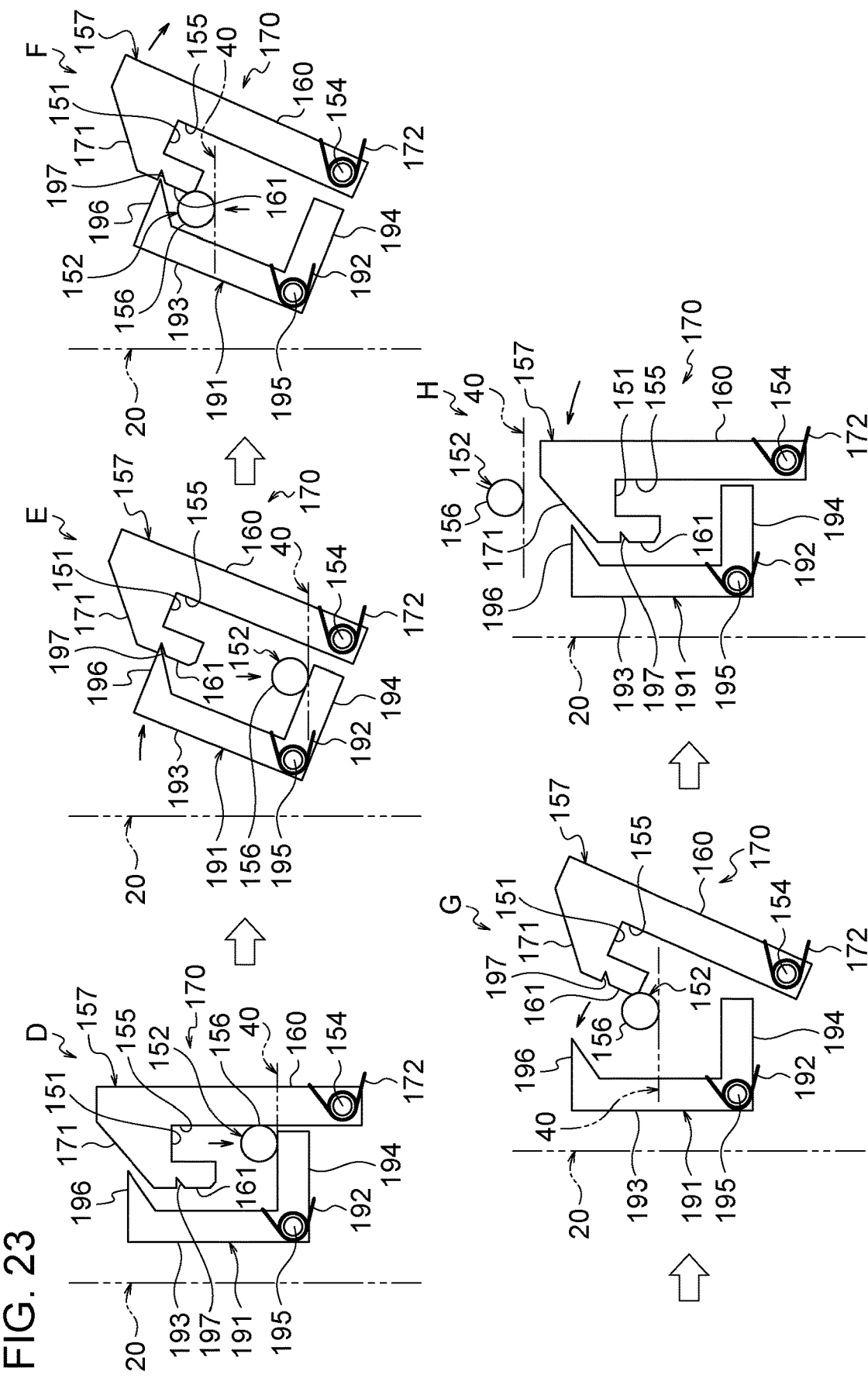

ELECTRONIC APPARATUS AND DUMMY DEVICE

CROSS-REFERENCE TO RELATED APPLICATION

This application is based upon and claims the benefit of priority of the prior Japanese Patent Application No. 2018-98043, filed on May 22, 2018, the entire contents of which are incorporated herein by reference.

FIELD

The embodiment discussed herein is related to an electronic apparatus and a dummy device.

BACKGROUND

In recent years, an electronic apparatus including a liquid immersion tank for storing a refrigerant and a plurality of electronic apparatuses stored in the liquid immersion tank has started to be used (for example, International Publication Pamphlet No. WO 2016/088280). In such an electronic apparatus, a plurality of electronic apparatuses are cooled by being immersed in a refrigerant.

SUMMARY

According to an aspect of the embodiments, an electronic apparatus includes a liquid immersion tank that stores a refrigerant and has a plurality of slots therein, an electronic device stored in one slot of the plurality of slots, a dummy device stored in another slot of the plurality of slots and formed in a hollow shape, the dummy device having a ceiling portion and a bottom portion, the ceiling portion having a first hole and an opening and closing portion to open and close the first hole, and the bottom portion being open, and a fixing portion that fixes the dummy device to the liquid immersion tank.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 23 is a view for describing an operation of an interlocking mechanism in FIG. 22.

DESCRIPTION OF EMBODIMENTS

In the above-described electronic apparatus of the related art, in a case where there is an empty slot in which the electronic apparatus is not stored in a liquid immersion tank, it is considered to store a hollow dummy unit (dummy device) in this empty slot. However, when the hollow dummy unit is used, when the fixing of the dummy unit to the liquid immersion tank is released in order to take out the dummy unit from the liquid immersion tank, due to the buoyancy of the dummy unit, there is a possibility that this dummy unit will rapidly float.

Hereinafter, one embodiment of a technique capable of suppressing the rapid flotation of the dummy unit when taking out the dummy unit from the liquid immersion tank will be described.

Figure 1:
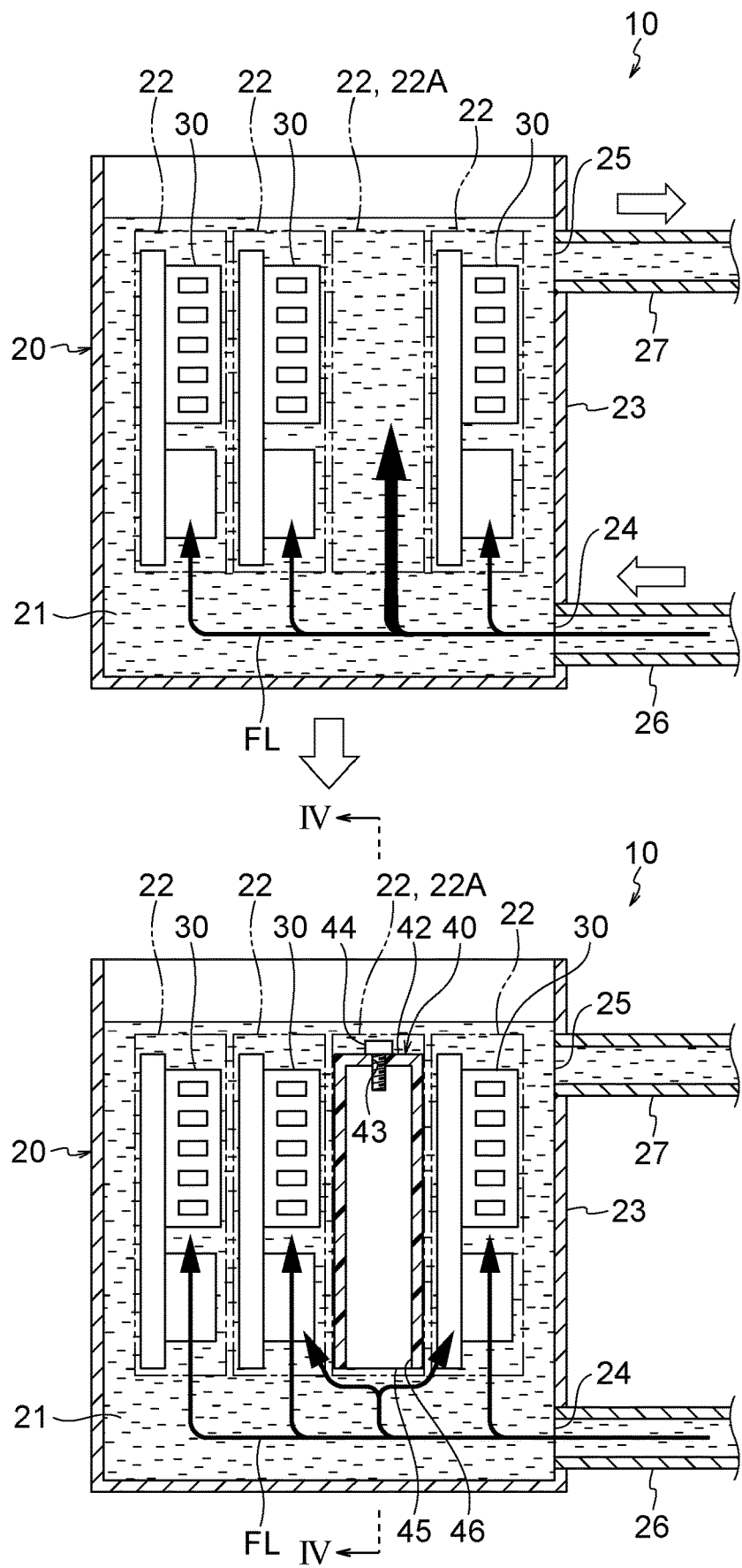
FIG. 1 is a view for describing how a dummy unit is stored in an empty slot in an electronic apparatus according to an embodiment of the present disclosure.

As illustrated in FIG. 1, an electronic apparatus 10 according to the present embodiment includes a liquid immersion tank 20 and a plurality of electronic devices 30. A refrigerant 21 (refrigerant liquid) is stored in the liquid immersion tank 20. For the refrigerant 21, for example, a fluorine-based inert liquid or oil is used as a liquid having insulating properties and high cooling efficiency.

A plurality of slots 22 are provided inside the liquid immersion tank 20. The plurality of slots 22 are arranged in a horizontal direction of the liquid immersion tank 20. Each of the plurality of slots 22 has a pair of fixing portions 28 (see FIG. 4) that fix both sides in the lateral width of the electronic device 30 as described later. The liquid immersion tank 20 is open to the upper side, and in each of the plurality of slots 22, the electronic device 30 is detachably stored from the upper side of the liquid immersion tank 20. The plurality of electronic devices 30 are mounted on a board, including components such as heating elements, and are cooled by being immersed in the refrigerant 21.

A refrigerant suction port 24 for sucking the refrigerant 21 inside the immersion tank 20 and a refrigerant discharge port 25 for discharging the refrigerant 21 inside the liquid immersion tank 20 are formed on a side wall 23 of the liquid immersion tank 20. The refrigerant suction port 24 is formed in the lower part of the side wall 23, and the refrigerant discharge port 25 is formed in the upper part of the side wall 23. A refrigerant suction pipe 26 is connected to the refrigerant suction port 24, and a refrigerant discharge pipe 27 is connected to the refrigerant discharge port 25.

A pump, a cooling device, and the like are connected between the refrigerant discharge pipe 27 and the refrigerant suction pipe 26, and the refrigerant 21 circulates between the liquid immersion tank 20 and the cooling device. Inside the liquid immersion tank 20, the refrigerant 21 flows from the lower side to the upper side from the side of the refrigerant suction port 24 toward the side of the refrigerant discharge port 25 as indicated by an arrow FL.

In the electronic apparatus 10 according to the present embodiment, as an example, there is used the liquid immersion tank 20 capable of storing the maximum number of electronic devices 30 allowed in terms of dimensions, and it is possible to operate to expand the electronic devices 30 in accordance with the expansion of the required performance. Therefore, in a state where the maximum number of electronic devices 30 are not stored, an empty slot 22A in which the electronic device 30 is not stored may be generated in the plurality of slots 22. In the example illustrated in FIG. 1, one empty slot 22A is generated in the plurality of slots 22.

However, as described above, in the state in which the empty slot 22A is generated, the refrigerant 21 sucked into the inside of the liquid immersion tank 20 from the refrigerant suction port 24 easily flows into the empty slot 22A. By concentrating the refrigerant 21 in the empty slot 22A, the refrigerant 21 stagnates around the electronic device 30 which becomes resistance to the flow of the refrigerant 21, and the cooling efficiency of the electronic device 30 decreases.

Here, it is considered to partition the plurality of slots 22 by walls and allow the refrigerant 21 to flow separately for each of the plurality of slots 22. However, in this case, the following problems may occur.
(1) A structure for separately flowing the refrigerant 21 for each of the plurality of slots 22 is required, resulting in an increase in cost.
(2) As the number of components of the liquid immersion tank 20 increases, the structure becomes complicated and the control for separately flowing the refrigerant 21 for each of the plurality of slots 22 becomes complicated, and therefore the structure is inferior in reliability and maintainability.
(3) Since the structure for separately flowing the refrigerant 21 for each of the plurality of slots 22 is integrally provided in the liquid immersion tank 20, the structure is wasted in the empty slot 22A in which the electronic device 30 is not stored.
(4) Adding a structure for allowing the refrigerant 21 to flow separately for each of the plurality of slots 22 increases the weight of the liquid immersion tank 20.

Figure 2:
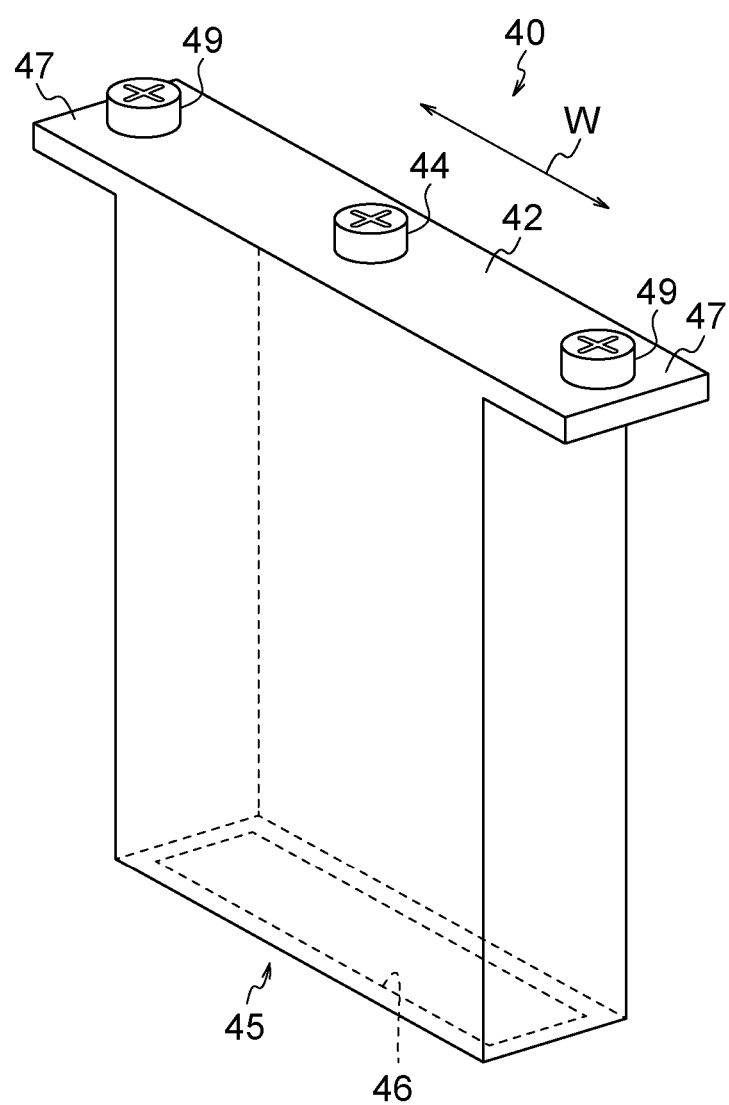
FIG. 2 is a perspective view of the dummy unit of FIG. 1.
Figure 3:
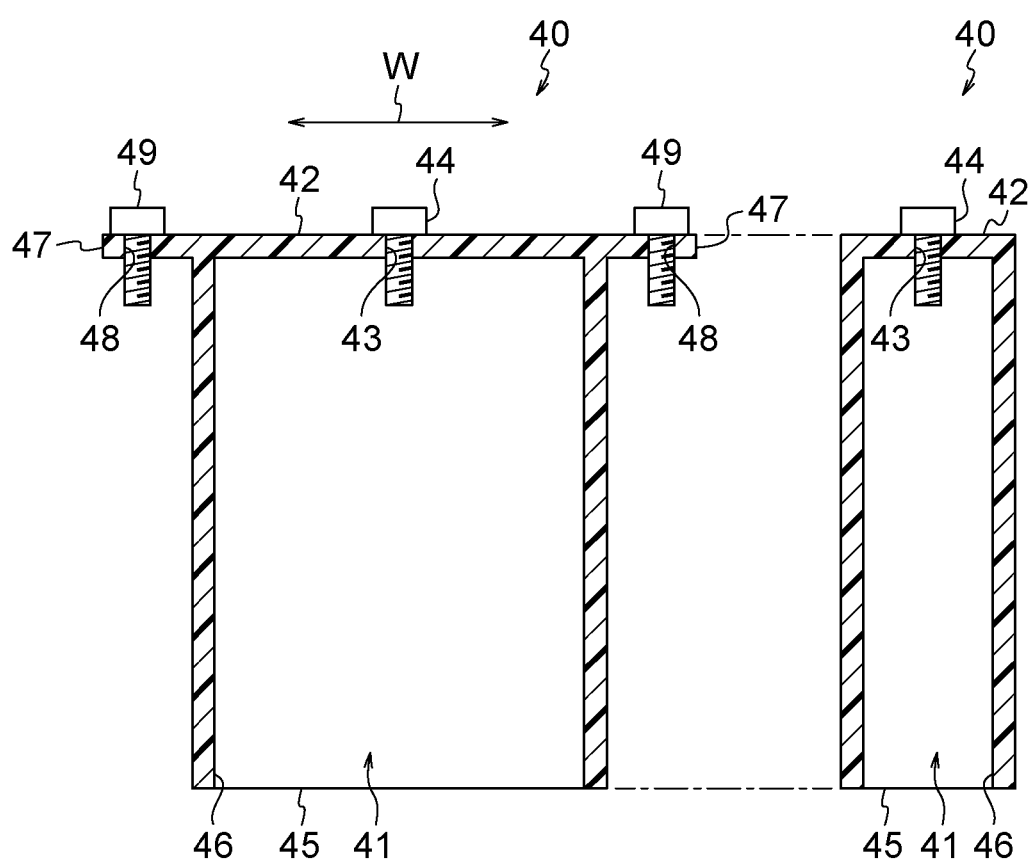
FIG. 3 is a two-sided cross-sectional view of the dummy unit of FIG. 1.

Therefore, in the electronic apparatus 10 according to the present embodiment, a dummy unit 40 (dummy device) (see also FIGS. 2 to 4) is stored in the empty slot 22A. In the present embodiment, the slot 22 in which the electronic device 30 is stored is an example of "one slot among a plurality of slots", and the empty slot 22A in which the dummy unit 40 is stored is an example of "another slot among the plurality of slots". The dummy unit 40 is formed of a hollow rectangular parallelepiped having a cavity portion 41 therein and has a volume equivalent to that of the electronic device 30. The dummy unit 40 is made of resin, for example, for weight reduction.

At the center of a ceiling portion 42 of the dummy unit 40, a screw hole 43, which is an example of a "first hole", is formed. The screw hole 43 penetrates the ceiling portion 42 in the vertical direction of the dummy unit 40 and communicates with a cavity portion 41. In this screw hole 43, a screw 44, which is an example of an "opening and closing portion", is screwed. In the present embodiment, one screw hole 43 is formed in the ceiling portion 42, but a plurality of screw holes 43 may be formed in the ceiling portion 42 and screws 44 may be screwed into each of the plurality of screw holes 43.

An opening port 46 is formed in a bottom portion 45 of the dummy unit 40. The opening port 46 is formed, for example, in the entire bottom portion 45. This opening port 46 opens downward and communicates with the cavity portion 41. In the present embodiment, the opening port 46 is formed in the entire bottom portion 45, but the opening port 46 may be formed in a part of the bottom portion 45.

Fixed portions 47 extending in the lateral width direction (direction of an arrow W) of the dummy unit 40 are formed at both ends of the ceiling portion 42 of the dummy unit 40. A through hole 48 through which the screw 44 may be inserted is formed in the fixed portion 47. The through hole 48 penetrates in the vertical direction of the dummy unit 40. The fixing portion 28 to be disposed on the lower side of the fixed portion 47 is provided inside the liquid immersion tank 20. In this fixing portion 28, a screw hole 29 is formed at a position aligned with the through hole 48.

Next, an operation method of the electronic apparatus 10 according to the present embodiment will be described.

As illustrated in FIG. 1, in the operation method of the electronic apparatus 10 according to the present embodiment, in a case where any one slot among the plurality of slots 22 is the empty slot 22A, the dummy unit 40 is stored in the empty slot 22A. At this time, the dummy unit 40 is stored in the empty slot 22A in a state where the screw hole 43 is closed by screwing the screw 44 into the screw hole 43.

In this way, when the dummy unit 40 is stored in the empty slot 22A from the upper side in a state where the screw hole 43 is closed, air accumulates in the dummy unit 40. This air forms a surface that becomes resistance to the refrigerant 21. Therefore, the refrigerant 21 flows while avoiding the dummy unit 40, whereby the refrigerant 21 is supplied to the plurality of electronic devices 30, and the plurality of electronic devices 30 are cooled.

Figure 4:
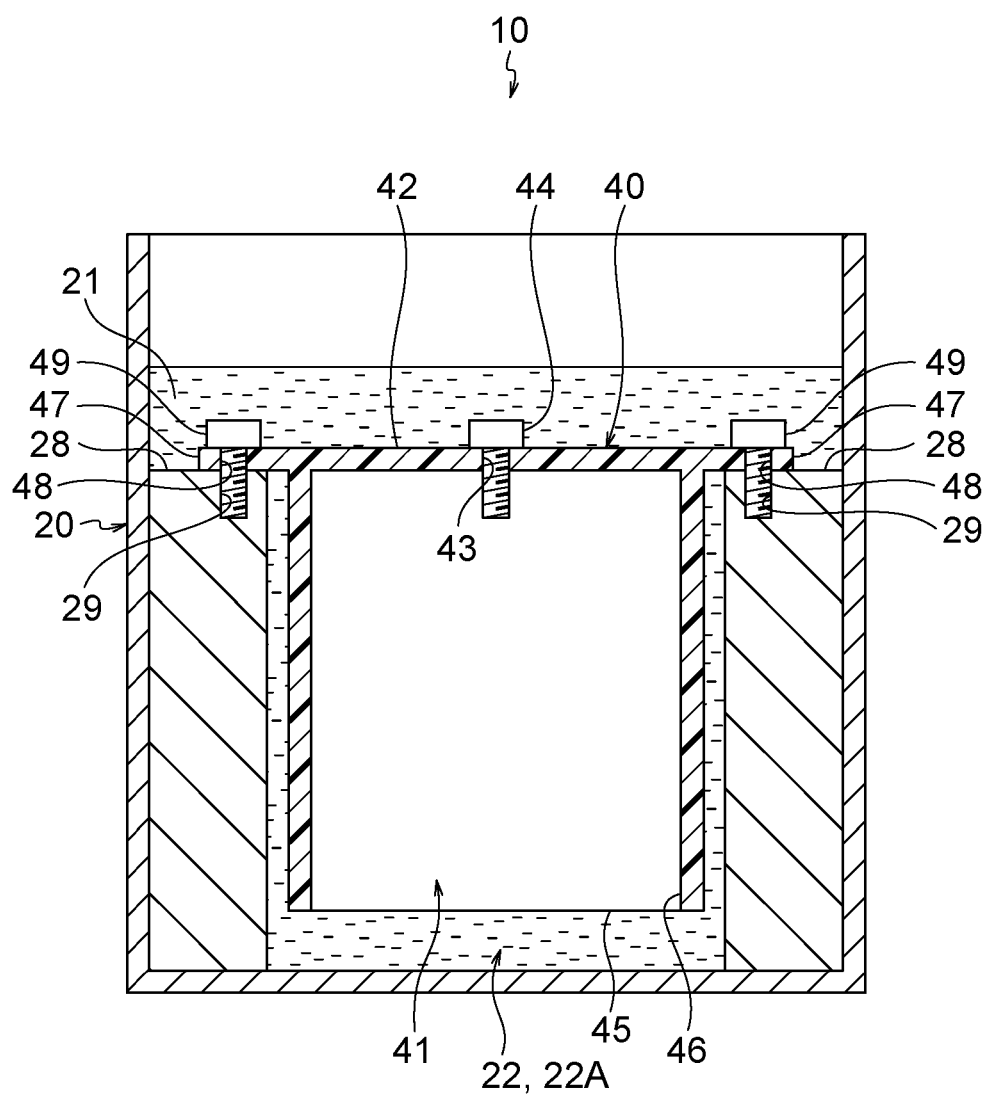
FIG. 4 is a cross-sectional view taken along the line IV-IV in FIG. 1.

In a state where the dummy unit 40 is stored in the empty slot 22A, the fixed portion 47 is supported by the fixing portion 28 from the lower side, as illustrated in FIG. 4. The screw 49 is inserted into the through hole 48 from the upper side and the screw 49 is screwed into the screw hole 29, whereby the dummy unit 40 is fixed to the liquid immersion tank 20. The screw 49 is an example of "a fixing portion that fixes the dummy unit to the liquid immersion tank".

Figure 5:
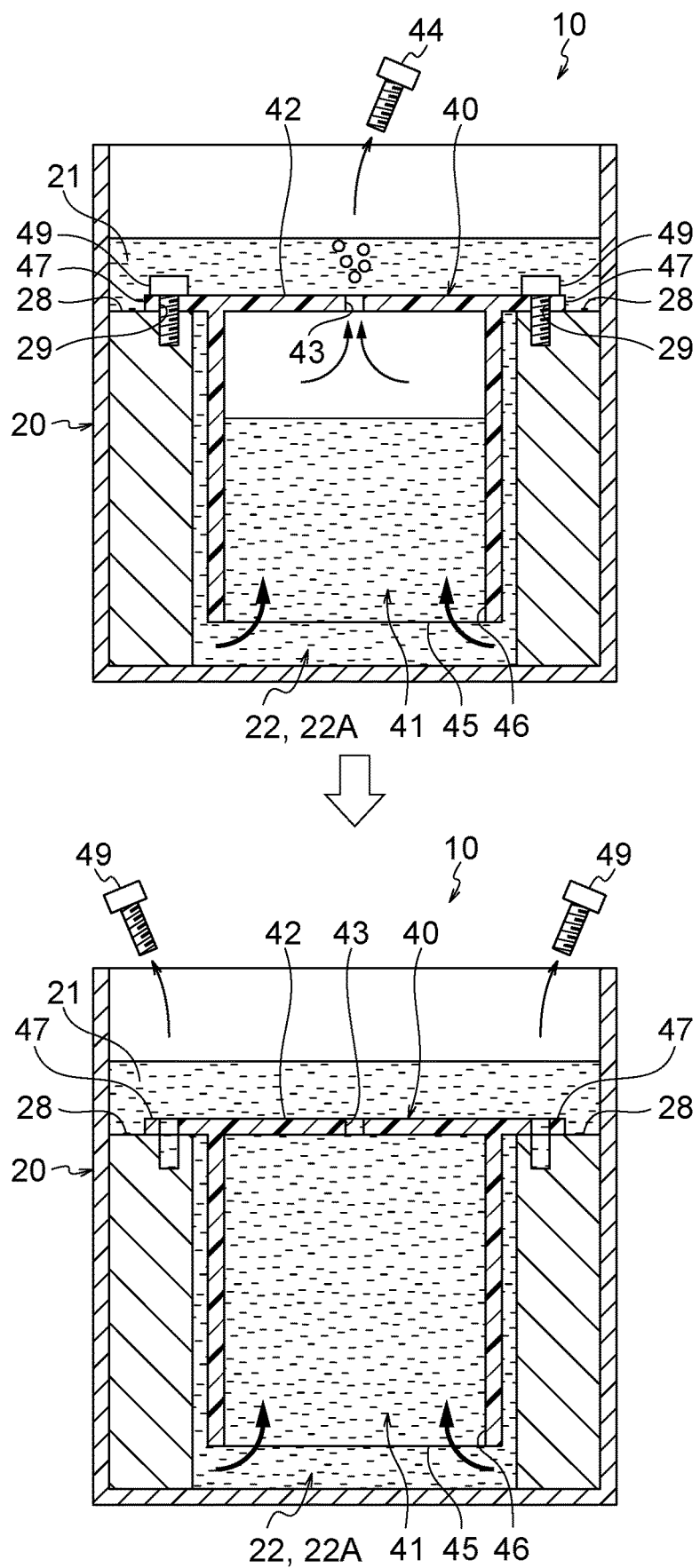
FIG. 5 is a view for describing how the dummy unit is taken out from the electronic apparatus in FIG. 1.

Subsequently, a case where the dummy unit 40 is taken out from the liquid immersion tank 20 will be described. In the case of taking out the dummy unit 40 from the liquid immersion tank 20, firstly, as illustrated in FIG. 5, the screw 44 is removed from the screw hole 43 to open the screw hole 43. When the screw hole 43 is opened, the air in the dummy unit 40 is discharged through the screw hole 43. As the air in the dummy unit 40 is discharged, the refrigerant 21 flows into the dummy unit 40 through the opening port 46.

As the air in the dummy unit 40 is discharged and the refrigerant 21 flows into the dummy unit 40, the buoyancy of the dummy unit 40 is reduced. As a result, even if the screw 49 is removed from the screw hole 29 and the fixing of the dummy unit 40 to the liquid immersion tank 20 is released as will be described later, the dummy unit 40 is suppressed from rapidly floating.

At this time, from the viewpoint of reducing the buoyancy of the dummy unit 40, it is preferable to discharge all the air in the dummy unit 40. However, as long as rapid flotation of the dummy unit 40 may be suppressed, fixing of the dummy unit 40 to the liquid immersion tank 20 may be released in a state where air remains in the dummy unit 40.

As described above, when the screw 44 is removed from the screw hole 43 and air in the dummy unit 40 is discharged through the screw hole 43, there is a concern that the refrigerant 21 may scatter from the screw hole 43. However, by appropriately changing the size and number of the screw holes 43, the discharge amount of air may be adjusted so that the scattering of the refrigerant 21 may be suppressed.

As described above, after the air in the dummy unit 40 is discharged, the screw 49 is removed from the screw hole 29, and the fixed state of the dummy unit 40 with respect to the liquid immersion tank 20 is released. When the fixed state of the dummy unit 40 with respect to the liquid immersion tank 20 is released as described above, the dummy unit 40 may be taken out from the liquid immersion tank 20. By taking out the dummy unit 40 from the liquid immersion tank 20, the electronic device 30 may be stored in place of the dummy unit 40.

Next, operations and effects of the present embodiment will be described.

(1) In the electronic apparatus 10, the dummy unit 40 is stored in the empty slot 22A in which the electronic device 30 is not stored. Therefore, this dummy unit 40 becomes resistance to the refrigerant 21 and the refrigerant 21 flows while avoiding the dummy unit 40, and therefore it is possible to supply the refrigerant 21 to the plurality of electronic devices 30. Thereby, the cooling efficiency of the plurality of electronic devices 30 may be enhanced.

(2) Since it is unnecessary to partition the plurality of slots 22 with walls by using the dummy unit 40, a structure for separately flowing the refrigerant 21 for each of the plurality of slots 22 becomes unnecessary. This may reduce the cost.

(3) Since it is unnecessary to complicate the structure of the liquid immersion tank 20 and to control the separate flow of the refrigerant 21 for each of the plurality of slots 22, reliability and maintainability may be secured.

(4) Since it is unnecessary to integrally provide a structure for separately flowing the refrigerant 21 for each of the plurality of slots 22 in the liquid immersion tank 20, it is possible to avoid the structure from being wasted in the empty slot 22A in which the electronic device 30 is not stored.

(5) Since it is unnecessary to add a structure for separately flowing the refrigerant 21 for each of the plurality of slots 22, it is possible to suppress an increase in the weight of the liquid immersion tank 20.

(6) The dummy unit 40 is formed in a hollow shape. Therefore, for example, an increase in weight may be suppressed as compared with a case where the dummy unit 40 is a solid body.

(7) In a state where the screw hole 43 is closed by the screw 44 to store the dummy unit 40 in the empty slot 22A, air may be stored in the dummy unit 40. Thus, since the amount of expensive refrigerant 21 used may be reduced, the cost may be reduced.

(8) When taking out the dummy unit 40 from the liquid immersion tank 20, if the screw 44 is removed from the screw hole 43 to open the screw hole 43, the air in the dummy unit 40 is discharged through the screw hole 43 and the refrigerant 21 flows into the dummy unit 40 through the opening port 46. As a result, the buoyancy of the dummy unit 40 is reduced, and thereafter, when the screw 49 is removed from the screw hole 29 and the fixing of the dummy unit 40 to the liquid immersion tank 20 is released, it is possible to suppress the rapid flotation of the dummy unit 40.

(9) The opening port 46 is formed in the bottom portion 45 of the dummy unit 40. Therefore, when taking out the dummy unit 40 from the liquid immersion tank 20, since the refrigerant 21 in the dummy unit 40 flows down only by lifting the dummy unit 40, the work for discharging the refrigerant 21 in the dummy unit 40 does not have to be performed.

(10) The dummy unit 40 has the same volume as the electronic device 30. Therefore, when the electronic device 30 is stored in the liquid immersion tank 20 instead of the dummy unit 40 at the time of adding the electronic device 30, it is possible to suppress the liquid level of the refrigerant 21 from rising and the refrigerant 21 from overflowing from the liquid immersion tank 20. Since it is unnecessary to adjust the amount of the refrigerant 21 at the time of adding the electronic device 30, workability at the time of adding the electronic device 30 may be improved.

(11) The screw hole 43 for discharging the air in the dummy unit 40 is formed in the ceiling portion 42, and the screw 44 for closing the screw hole 43 is screwed in the screw hole 43. Therefore, since the screw 44 and the screw hole 43 are used, the structure may be simplified and the cost may be reduced.

Next, a modification example of the present embodiment will be described.

First Modification Example

Figure 6:
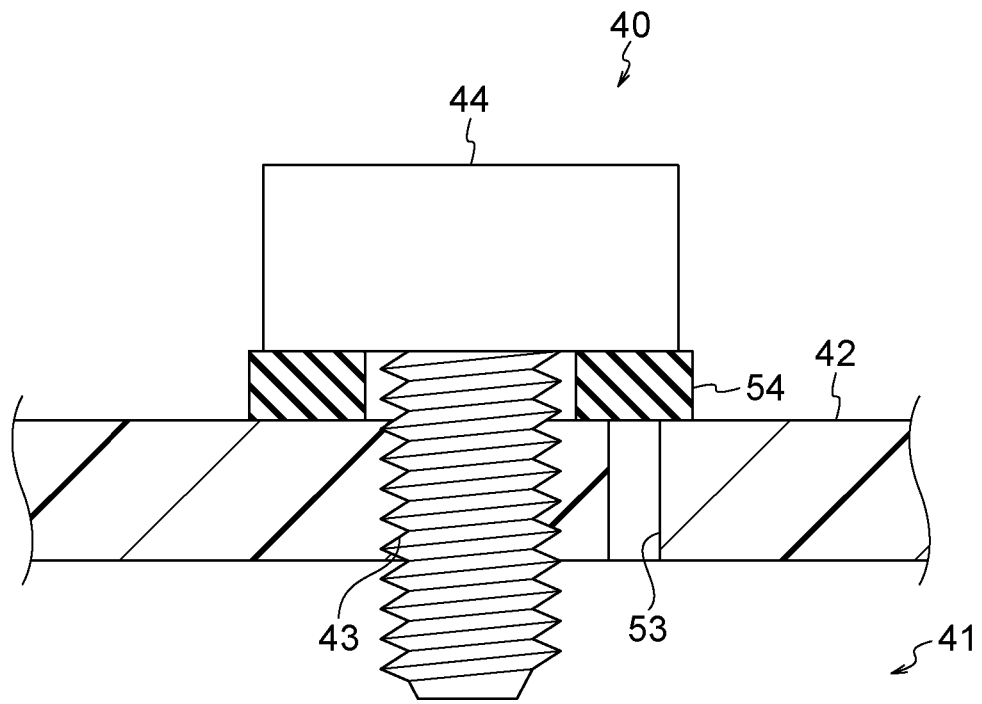
FIG. 6 is a view illustrating a first modification example of the electronic apparatus in FIG. 1.

In a first modification example illustrated in FIG. 6, a discharge port 53, which is an example of a "second hole", is formed in the ceiling portion 42 in the above embodiment. The discharge port 53 penetrates the ceiling portion 42 in the vertical direction of the dummy unit 40 and communicates with the cavity portion 41. The discharge port 53 is formed in the vicinity of the screw hole 43 (a part of the periphery of the screw hole 43). Although one discharge port 53 is illustrated in FIG. 6, a plurality of discharge ports 53 may be formed around the screw hole 43.

In this first modification example, a ring-shaped sealing member 54 is used. The sealing member 54 has flexibility and elasticity. The sealing member 54 is an example of the "opening and closing portion" for opening and closing the discharge port 53. In this first modification example, in a state where the screw 44 is screwed into the screw hole 43, the sealing member 54 is interposed between the head portion of the screw 44 and the ceiling portion 42, and the discharge port 53 is closed by the sealing member 54.

According to the first modification example, the close contact state between the sealing member 54 and the ceiling portion 42 is canceled by loosening the screw 44. As a result, since the discharge port 53 is opened, the air in the dummy unit 40 may be discharged through the discharge port 53.

It is possible to improve the sealing property between the head portion of the screw 44 and the ceiling portion 42 in a state where the screw 44 is tightened by using the sealing member 54. Thus, leakage of air from the discharge port 53 may be suppressed.

Since the prescribed fastening force of the screw 44 may be lowered by using the sealing member 54, workability may be improved. When discharging the air in the dummy unit 40, it is sufficient to loosen the screw 44 and it is unnecessary to remove the screw 44, and therefore it is possible to improve the workability when discharging the air in the dummy unit 40 and to suppress the loss of the screw 44.

Second Modification Example

Figure 7:
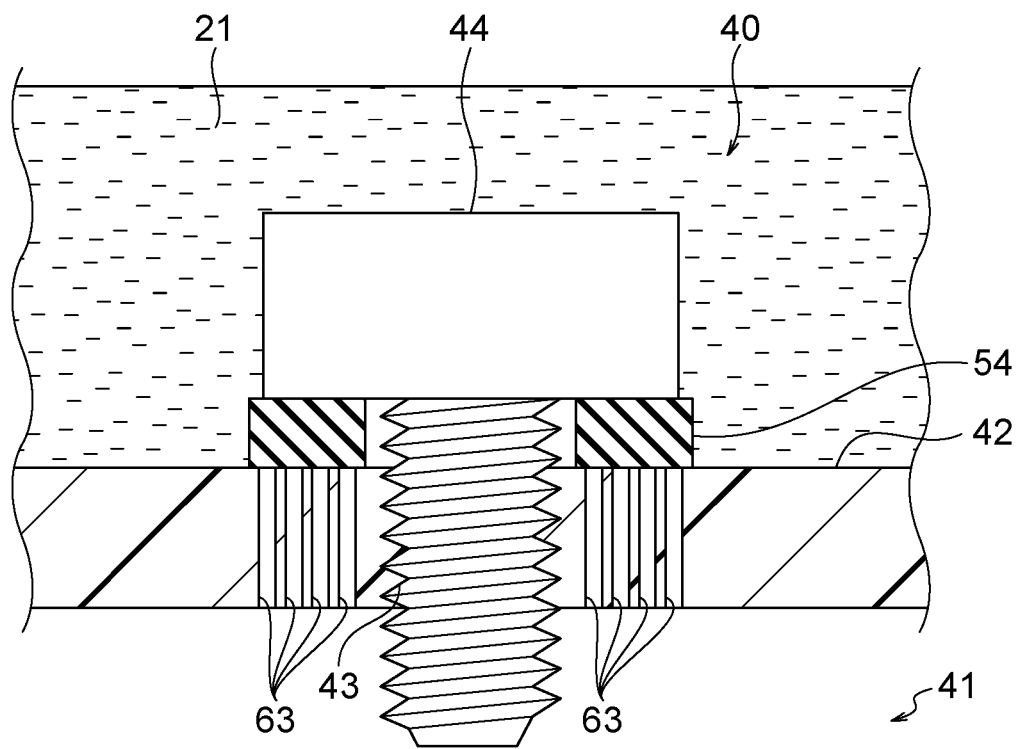
FIG. 7 is a view illustrating a second modification example of the electronic apparatus in FIG. 1.

In a second modification example illustrated in FIG. 7, a plurality of pores 63, which is an example of the "second hole", are formed in the ceiling portion 42 in the first modification example described above. The plurality of pores 63 penetrate the ceiling portion 42 in the vertical direction of the dummy unit 40 and communicate with the cavity portion 41. Each of the plurality of pores 63 is formed to be smaller in diameter than the discharge port 53 (FIG. 6) described above. The plurality of pores 63 are formed around the screw hole 43.

According to this second modification example, when the screw 44 is loosened, the air discharged from the plurality of pores 63 becomes foamy, and therefore it is possible to suppress the refrigerant 21 from being ejected by the air discharged from the plurality of pores 63. It is possible to suppress an increase in air discharge time by providing the plurality of pores 63.

Third Modification Example

Figure 8:
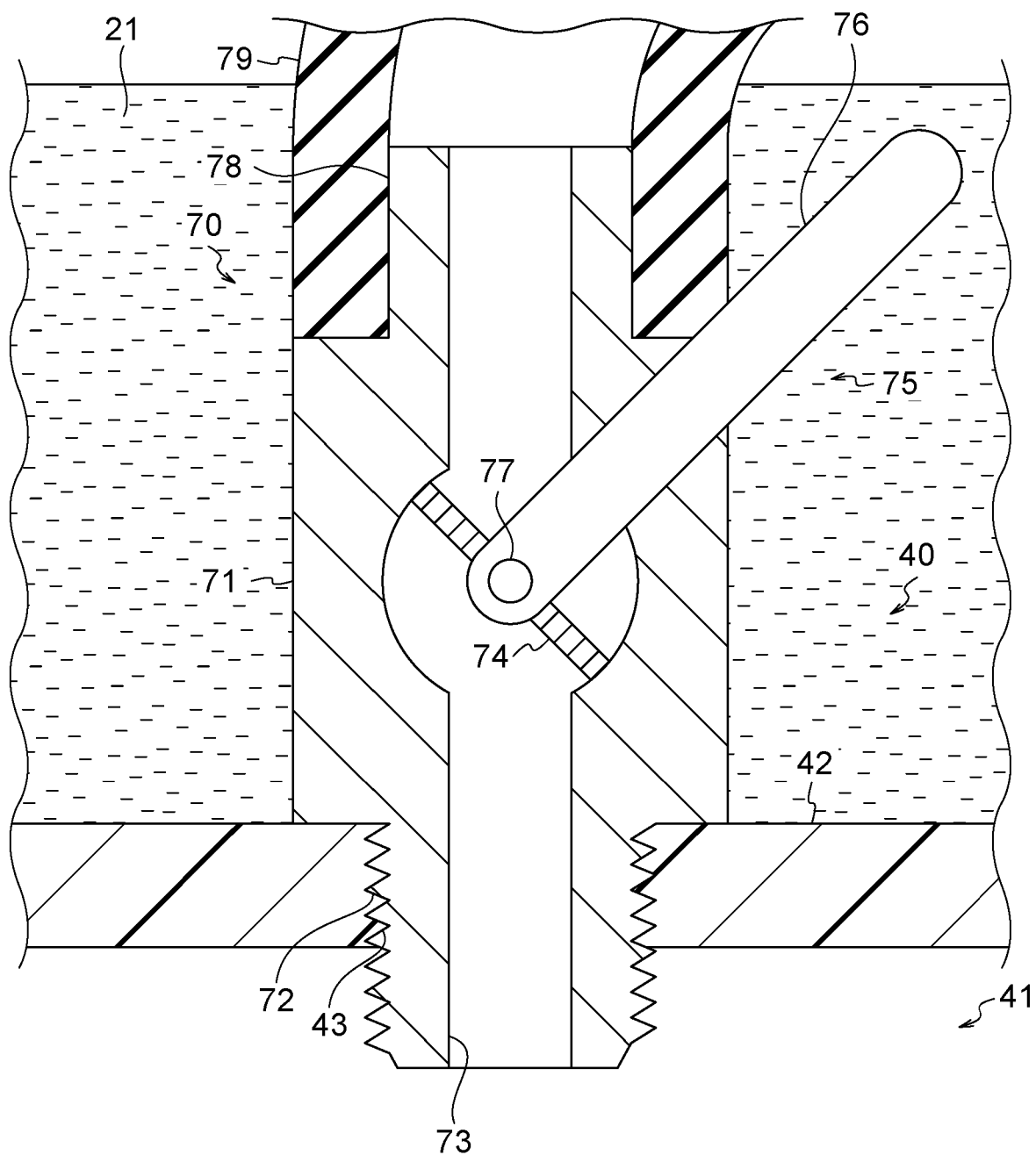
FIG. 8 is a view illustrating a third modification example of the electronic apparatus in FIG. 1.

In a third modification example illustrated in FIG. 8, a valve mechanism 70 is provided on the ceiling portion 42 in the above embodiment. The valve mechanism 70 includes a case 71. A screw portion 72 is formed at the lower end portion of the case 71, and the screw portion 72 is screwed into the screw hole 43. Inside the case 71, a discharge hole 73 which is an example of the "first hole" is formed. The discharge hole 73 penetrates in the vertical direction of the dummy unit 40 and communicates with the cavity portion 41.

The valve mechanism 70 includes a valve 74 and a switching mechanism 75. The valve 74 is an example of the "opening and closing portion" that opens and closes the discharge hole 73 and is disposed in the center portion of the discharge hole 73 in the vertical direction. The switching mechanism 75 has a switching lever 76 and a rotating shaft 77. The valve 74 is provided at the base end portion of the switching lever 76. The rotating shaft 77 extends in the horizontal direction and rotatably supports the base end portion of the switching lever 76 with respect to the case 71. The tip end portion of the switching lever 76 protrudes outside the case 71. A connection portion 78 is formed at the upper end portion of the case 71, and a hose 79 is connected to the connection portion 78.

In the valve mechanism 70, the valve 74 may be switched between the open state and the closed state by operating the tip end portion of the switching lever 76 to rotate the switching lever 76.

According to the third modification, it is possible to switch between the open state and the closed state of the valve 74 by switching the switching lever 76, thereby improving working efficiency when discharging the air in the dummy unit 40. Since the open and closed state of the valve 74 may be grasped by the position of the switching lever 76, it is possible to suppress forgetting to close the valve 74.

The connection portion 78 is formed at the upper end portion of the case 71, and the hose 79 is connected to the connection portion 78. Therefore, when the valve 74 is opened and air is discharged from the discharge hole 73, the hose 79 may discharge the air to a certain place. Thereby, when the air is discharged from the discharge hole 73, it is possible to suppress the scattering of the refrigerant 21 in the vicinity of the ceiling portion 42 by the air to be discharged from the discharge hole 73.

Fourth Modification Example

Figure 9:
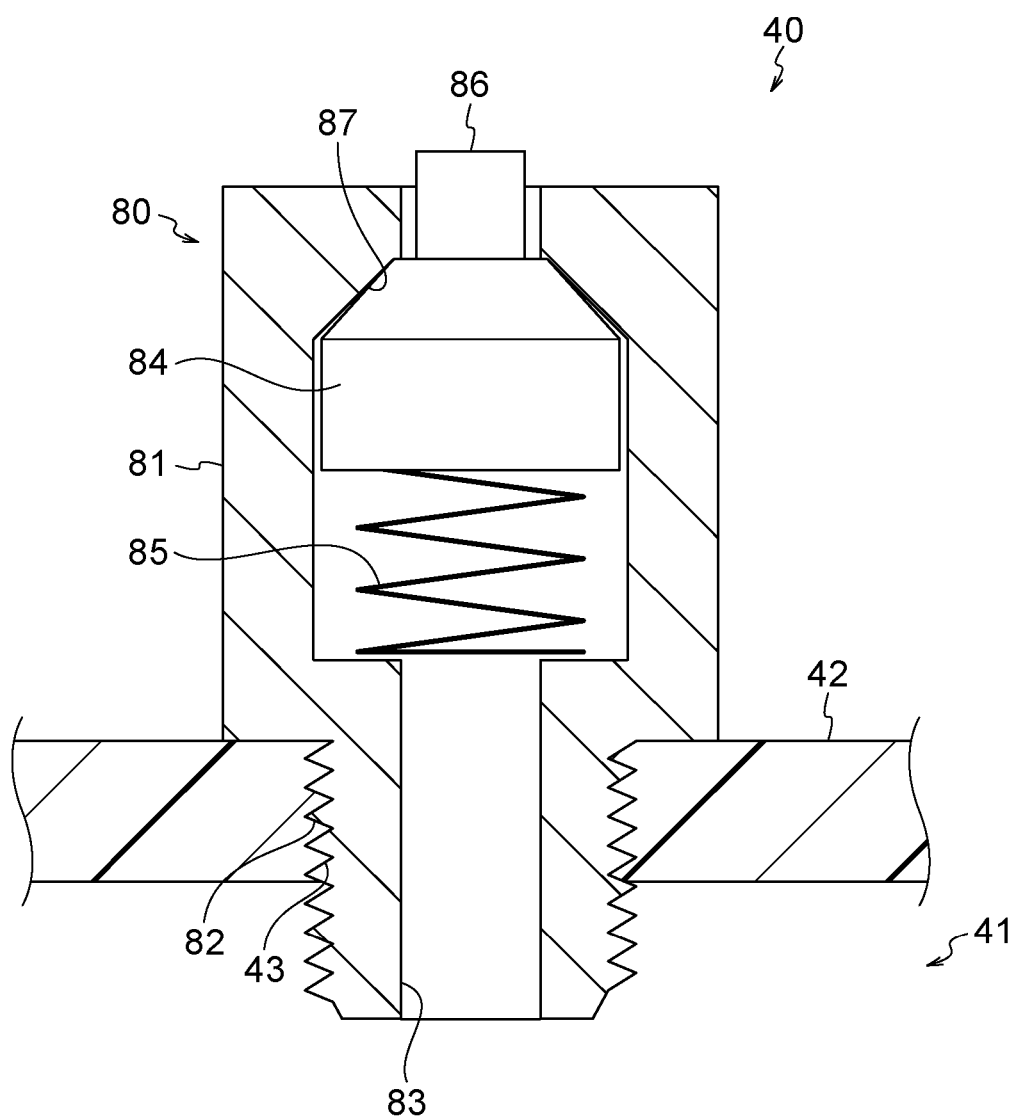
FIG. 9 is a view illustrating a fourth modification example of the electronic apparatus in FIG. 1.

In a fourth modification example illustrated in FIG. 9, a plug mechanism 80 is provided on the ceiling portion 42 in the above embodiment. The plug mechanism 80 includes a case 81. A screw portion 82 is formed at the lower end portion of the case 81, and the screw portion 82 is screwed into the screw hole 43. Inside the case 81, a discharge hole 83 which is an example of the "first hole" is formed. The discharge hole 83 penetrates in the vertical direction of the dummy unit 40 and communicates with the cavity portion 41.

The plug mechanism 80 includes a plug 84 and an urging member 85. The plug 84 is an example of the "opening and closing portion" that opens and closes the discharge hole 83 and is disposed above the discharge hole 83. The plug 84 has a protruding portion 86 protruding upward from the upper opening of the discharge hole 83. The urging member 85 is a coil spring, for example, interposed between the bottom wall portion of the case 81 and the plug 84 and urges the plug 84 toward the upper opening of the discharge hole 83. A tapered portion 87 is formed on the side of the upper opening of the discharge hole 83.

In the plug mechanism 80, the plug 84 is urged by the urging member 85, whereby the plug 84 is brought into close contact with the tapered portion 87 and is in a closed state. By pushing down the protruding portion 86 and moving the plug 84 downward against the urging force of the urging member 85, the plug 84 is separated from the tapered portion 87, and the plug 84 is opened. When the plug 84 is in the open state, air is discharged from the discharge hole 83.

According to this fourth modification example, unless the protruding portion 86 of the plug 84 is deliberately pushed down, the discharge hole 83 is maintained in a closed state by the plug 84. Thus, it is possible to suppress air from leaking from the discharge hole 83 due to a work error such as forgetting to close the plug 84.

Fifth Modification Example

Figure 10:
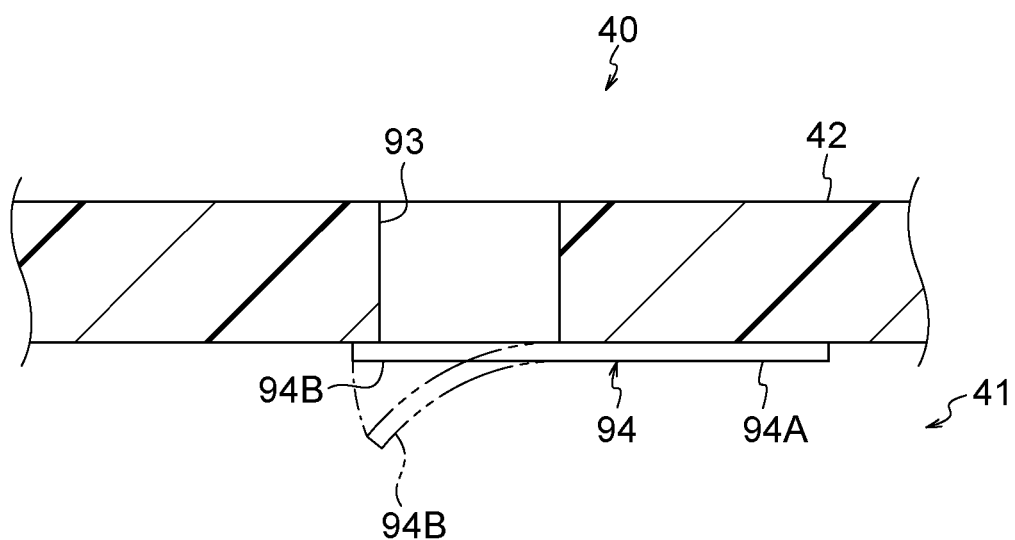
FIG. 10 is a view illustrating a fifth modification example of the electronic apparatus in FIG. 1.

In a fifth modification example illustrated in FIG. 10, a discharge hole 93 is formed in the ceiling portion 42, and a sheet member 94 for opening and closing the discharge hole 93 is provided in the ceiling portion 42 in the above embodiment. The discharge hole 93 is an example of the "first hole", and the sheet member 94 is an example of the "opening and closing portion". The discharge hole 93 penetrates the ceiling portion 42 in the vertical direction of the dummy unit 40 and communicates with the cavity portion 41.

The sheet member 94 is formed in an elastic plate shape. One end side 94A of the sheet member 94 is fixed to the lower surface of the ceiling portion 42, and the other end side 94B of the sheet member 94 closes the discharge hole 93 from the lower side of the ceiling portion 42 (the inside of the dummy unit 40). The other end side 94B of the sheet member 94 is not fixed to the ceiling portion 42 and opens and closes the discharge hole 93 in accordance with elastic deformation. In FIG. 10, a state where the other end side 94B of the sheet member 94 is separated from the ceiling portion 42 is indicated by an imaginary line. When the other end side 94B of the sheet member 94 is separated from the ceiling portion 42 in this manner, the discharge hole 93 is opened.

According to this fifth modification example, in a state (see FIG. 4) where the dummy unit 40 is stored in the liquid immersion tank 20, the other end side 94B of the sheet member 94 is pressed against the lower surface of the ceiling portion 42 by the pressure of the air in the dummy unit 40, whereby the discharge hole 93 may be closed. Thus, it is possible to suppress the leakage of air from the discharge hole 93 due to a work error such as forgetting to close the discharge hole 93.

On the other hand, when taking out the dummy unit 40 from the liquid immersion tank 20 (see FIG. 5), it is sufficient to insert a finger or the like into the discharge hole 93 and push the other end side 94B of the sheet member 94 downward to separate the sheet member 94 from the ceiling portion 42, and therefore it is possible to improve the workability in opening the discharge hole 93. Since the number of components for opening and closing the discharge hole 93 may be reduced, it is possible to enhance the reliability and to reduce the cost.

Sixth Modification Example

Figure 11:
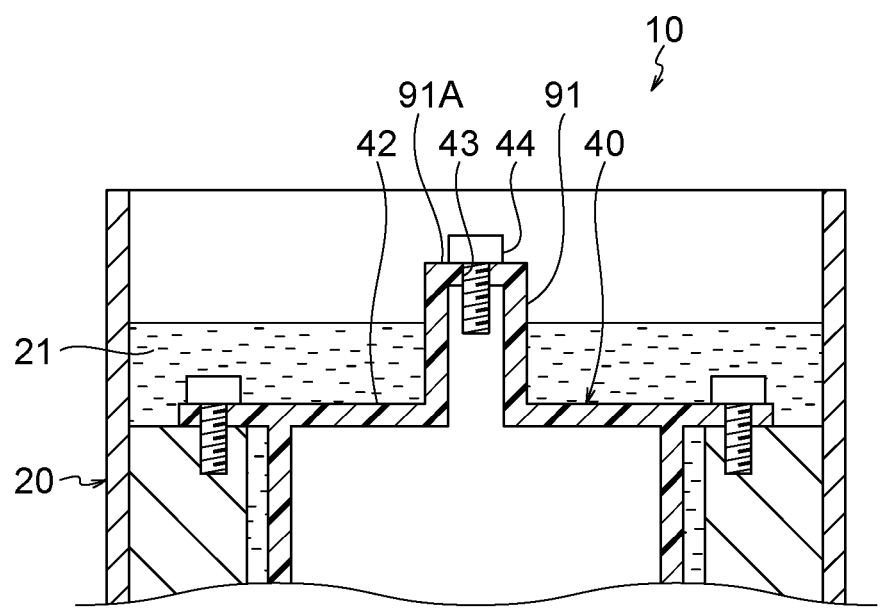
FIG. 11 is a view illustrating a sixth modification example of the electronic apparatus in FIG. 1.

In the sixth modification example illustrated in FIG. 11, a bulging portion 91 bulging toward the upper side of the dummy unit 40 is formed in the ceiling portion 42, and the screw hole 43 is formed in the upper end portion 91A of the bulging portion 91 in the above embodiment. In a state where the dummy unit 40 is stored in the liquid immersion tank 20, the upper end portion 91A of the bulging portion 91 is set to a height positioned higher than the liquid level when the refrigerant 21 is filled.

According to the sixth modification example, in a state where the dummy unit 40 is stored in the liquid immersion tank 20, the upper end portion 91A of the bulging portion 91 is positioned above the liquid level of the refrigerant 21. Therefore, when removing the screw 44 from the screw hole 43 to discharge the air in the dummy unit 40 from the screw hole 43, the air to be discharged from the screw hole 43 does not pass through the refrigerant 21, and therefore it is possible to suppress the scattering of the refrigerant 21 by the air to be discharged from the screw hole 43.

The configuration having the bulging portion 91 of the sixth modification example may be applied to the above-described first to fifth modification examples.

Seventh Modification Example

Figure 12:
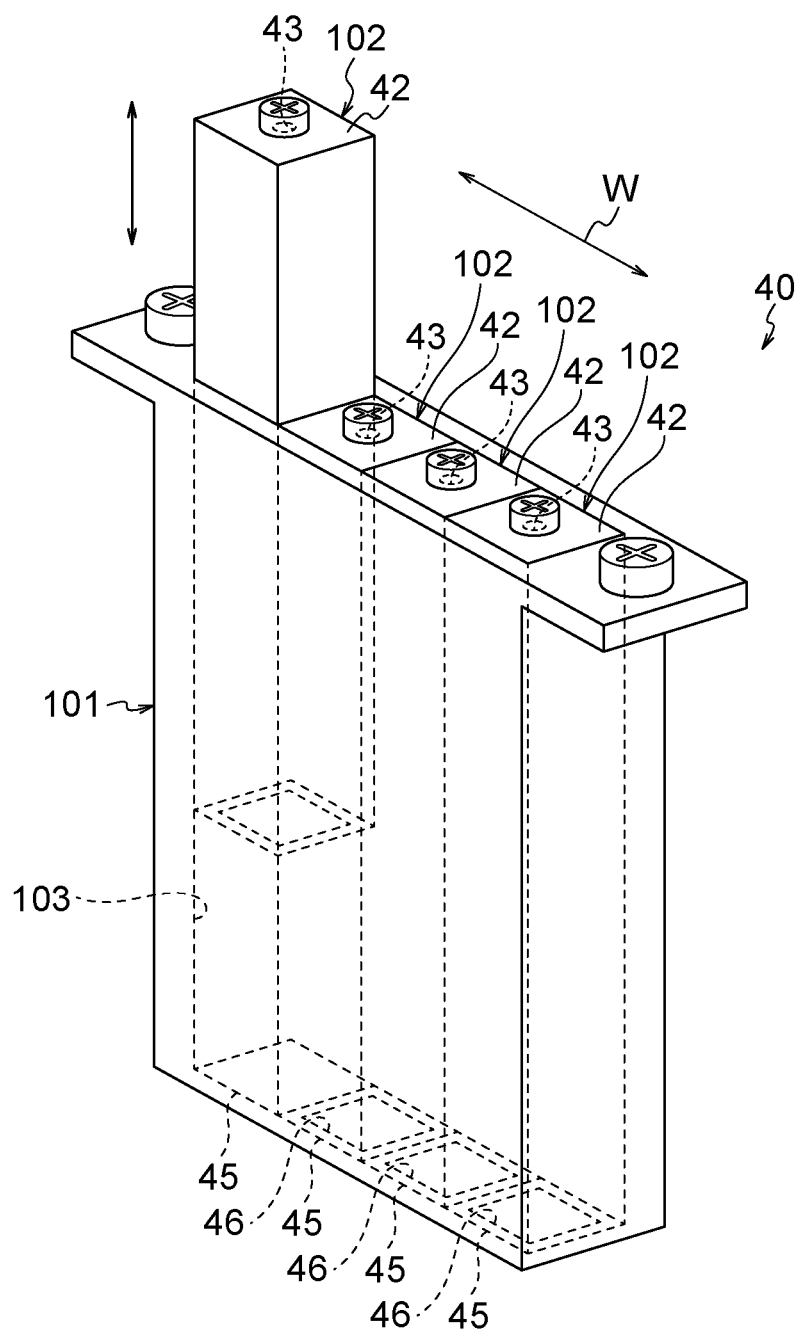
FIG. 12 is a view illustrating a seventh modification example of the electronic apparatus in FIG. 1.

In a seventh modification example illustrated in FIG. 12, the dummy unit 40 has a case 101 and a plurality of hollow units 102 in the above embodiment. The case 101 has an accommodating portion 103 penetrating in the vertical direction of the dummy unit 40 and is stored in the liquid immersion tank 20 (see FIG. 4). The plurality of hollow units 102 are accommodated in the accommodating portion in a state of being arranged in the lateral width direction (direction of the arrow W) of the case 101.

Each of the plurality of hollow units 102 has the ceiling portion 42 and the bottom portion 45 as described above, and the screw hole 43 and the opening port 46 are formed in each of the ceiling portion 42 and the bottom portion 45, respectively. The screws 44 are screwed into the screw holes 43, respectively.

According to this seventh modification example, it is possible to reduce the force required to accommodate each hollow unit 102 by sequentially accommodating the plurality of hollow units 102 in the case 101, thereby improving workability.

The configuration having the plurality of hollow units 102 according to the seventh modification example may be applied to the above-described first to sixth modification examples.

Eighth Modification Example

Figure 13:
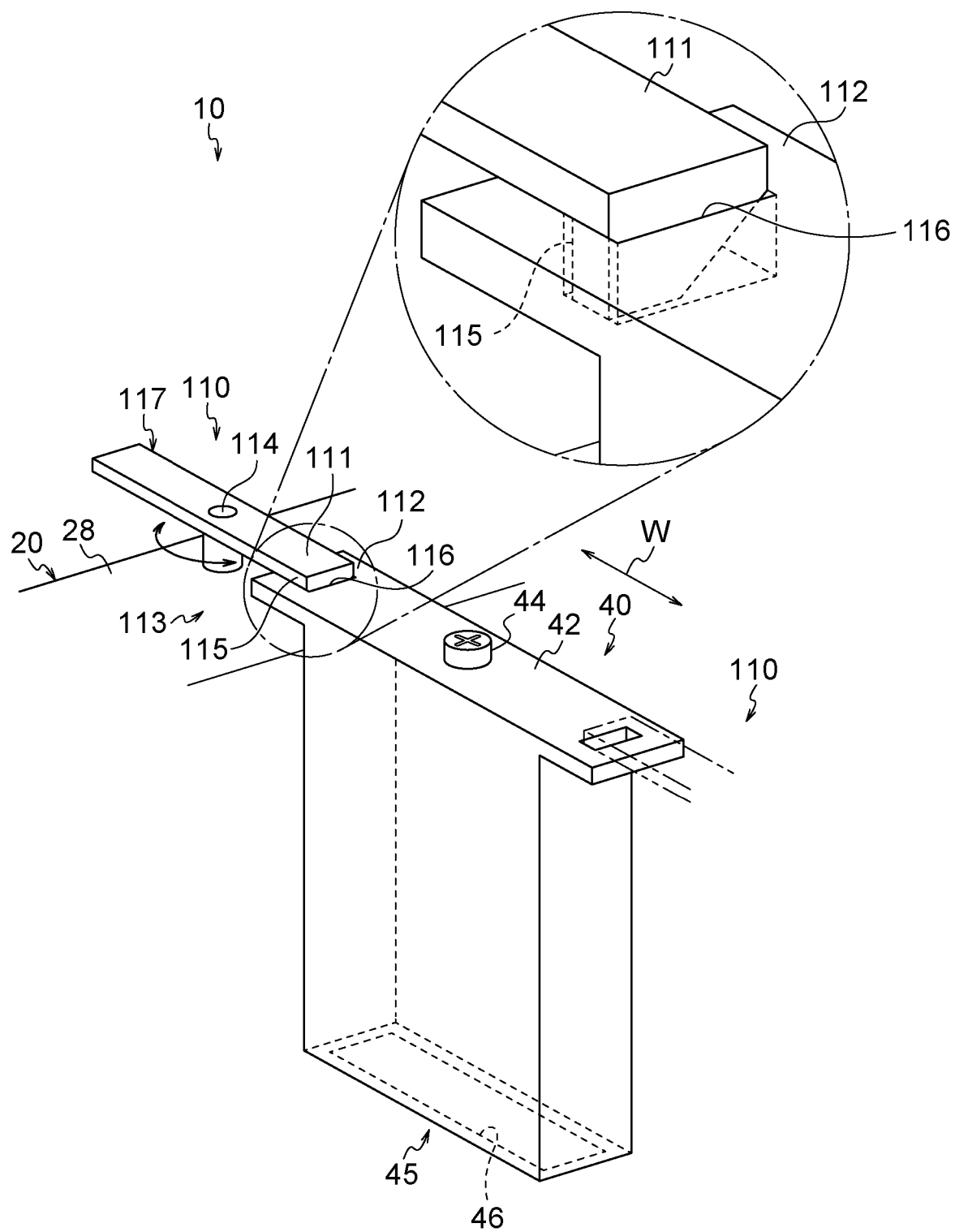
FIG. 13 is a view illustrating an eighth modification example of the electronic apparatus in FIG. 1.

In the eighth modification example illustrated in FIG. 13, a fixing mechanism 110 is used for the above embodiment. The fixing mechanism 110 is an example of "a fixing portion that fixes the dummy unit to the liquid immersion tank". The fixing mechanism 110 is preferably provided on both sides of the dummy unit 40 in the lateral width direction (direction of the arrow W). In FIG. 13, one fixing mechanism 110 is illustrated in the entirety thereof, but for the sake of convenience, only a part of the other fixing mechanism 110 is indicated by an imaginary line.

The pair of fixing mechanisms 110 are symmetrically formed in the lateral width direction of the dummy unit 40. The fixing mechanism 110 includes an abutting portion 111, an abutting target portion 112, and a releasing mechanism 113. The releasing mechanism 113 enables release of the restricted state of the abutting portion 111 and the abutting target portion 112 as will be described later and includes a rotating shaft 114, an engaging portion 115, an engaging target portion 116, and a lever member 117.

The lever member 117 is an example of a "movable member". The lever member 117 is formed in a plate shape extending in the horizontal direction and is provided in the liquid immersion tank 20. The abutting portion 111 is formed at the tip end portion of the lever member 117. The abutting target portion 112 extends outward from the end portion of the ceiling portion 42 of the dummy unit 40 in the lateral width direction of the dummy unit 40.

The rotating shaft 114 is an example of a "supporting portion" and is formed with the vertical direction of the liquid immersion tank 20 as an axial direction. The above-described lever member 117 is rotatably supported by the fixing portion 28 by the rotating shaft 114. As a result, the abutting portion 111 formed on the lever member 117 is movable to a restricting position opposing the abutting target portion 112 from the upper side of the abutting target portion and a restriction releasing position shifted with respect to the abutting target portion 112 in the horizontal direction.

The engaging portion 115 is formed at the tip end portion of the abutting portion 111 and is formed in a protruding shape protruding downward. The engaging target portion 116 is formed in the abutting target portion 112 and is formed in a concave shape that opens upward. The engaging target portion 116 is engaged with the engaging portion 115 in a case where the abutting portion 111 abuts against the abutting target portion 112 at the restricting position. In a case where the dummy unit 40 moves downward from a state where the abutting portion 111 abuts against the abutting target portion 112 at the restricting position, the engaging target portion 116 is positioned below the engaging portion 115, whereby the engaged state with the engaging portion 115 is released.

Figure 14:
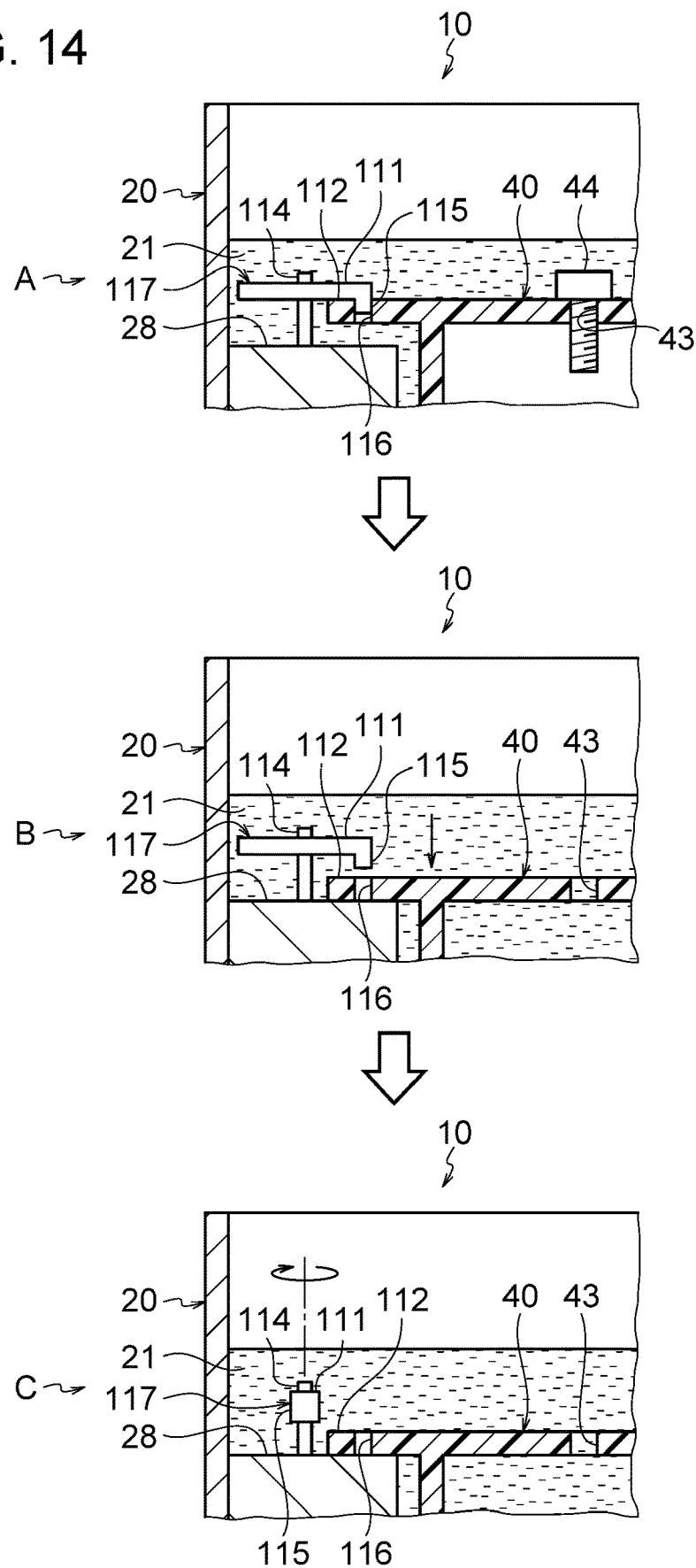
FIG. 14 is a view for describing an operation of a fixing mechanism in FIG. 13.

In this eighth modification example, as illustrated in the state A in FIG. 14, in a state where the dummy unit 40 is stored in the liquid immersion tank 20, the lever member 117 is rotated, and the abutting portion 111 formed on the lever member 117 is positioned at the restricting position. When the abutting portion 111 is positioned at the restricting position, the abutting portion 111 is positioned above the abutting target portion 112 provided in the dummy unit 40 and faces the abutting target portion 112.

In this state, buoyancy is generated in the dummy unit 40 by the air filled in the dummy unit 40, and the dummy unit 40 floats, whereby the abutting target portion 112 abuts against the abutting portion 111 from the lower side. As a result, the upward movement (floating) of the dummy unit 40 is restricted. At this time, the engaging portion 115 and the engaging target portion 116 are engaged, and the rotation of the lever member 117 is restricted.

As described above, according to the eighth modification example, in a state where the dummy unit 40 is stored in the liquid immersion tank 20, the abutting portion 111 may be abutted against the abutting target portion 112 from the upper side by rotating the lever member 117 and positioning the abutting portion 111 at the restricting position. As a result, since movement (floating) of the dummy unit 40 to the upper side may be restricted, for example, the workability at the time of fixing the dummy unit 40 may be improved as compared with a case where the dummy unit 40 is fixed to the liquid immersion tank 20 with screws while pressing the dummy unit 40.

On the other hand, as illustrated in the state B of FIG. 14, when the screw 44 is removed from the screw hole 43 to open the screw hole 43, the air inside the dummy unit 40 is discharged through the screw hole 43. As the air in the dummy unit 40 is discharged, the refrigerant 21 flows into the dummy unit 40 through the opening port 46 (see FIG. 13), and the buoyancy of the dummy unit 40 decreases.

When the buoyancy of the dummy unit 40 becomes smaller than the gravity applied to the dummy unit 40, the dummy unit 40 itself moves downward. The abutting target portion 112 descends integrally with the dummy unit 40 and the engaging target portion 116 is positioned below the engaging portion 115, whereby the engaged state of the engaging portion 115 and the engaging target portion 116 is released. In this state, it is possible to rotate the lever member 117 so that the abutting portion 111 is shifted with respect to the abutting target portion 112 in the horizontal direction.

Subsequently, as illustrated in a state C of FIG. 14, when the lever member 117 is rotated to position the abutting portion 111 at the restriction releasing position, the abutting portion 111 is shifted with respect to the abutting target portion 112 in the horizontal direction. As described above, when the abutting portion 111 is shifted with respect to the abutting target portion 112 in the horizontal direction, the dummy unit 40 may be taken out from the liquid immersion tank 20.

As described above, according to the eighth modification example, when taking out the dummy unit 40 from the liquid immersion tank 20, it is mandatory to rotate the lever member 117 to position the abutting portion 111 at the restriction releasing position. In order to position the abutting portion 111 at the restriction releasing position, it is mandatory to move the dummy unit 40 downward to release the engaged state between the engaging portion 115 and the engaging target portion 116.

As a result, the order of operations may be defined so that the screw 44 is removed from the screw hole 43, the air in the dummy unit 40 is discharged, and then the lever member 117 is rotated. Therefore, when taking out the dummy unit 40 from the liquid immersion tank 20, it is possible to suppress the lever member 117 from being rotated prior to discharging the air in the dummy unit 40 and to more effectively suppressing the rapid flotation of the dummy unit 40.

The releasing mechanism 113 for releasing the restricted state of the abutting portion 111 and the abutting target portion 112 is a mechanical structure having the lever member 117, the rotating shaft 114, the engaging portion 115, and the engaging target portion 116. Therefore, for example, the structure may be simplified and reduced in weight as compared with a case where an electrical structure is used for the releasing mechanism 113.

The fixing mechanism 110 of the eighth modification example may be applied to the above-described first to seventh modification examples.

Ninth Modification Example

Figure 15:
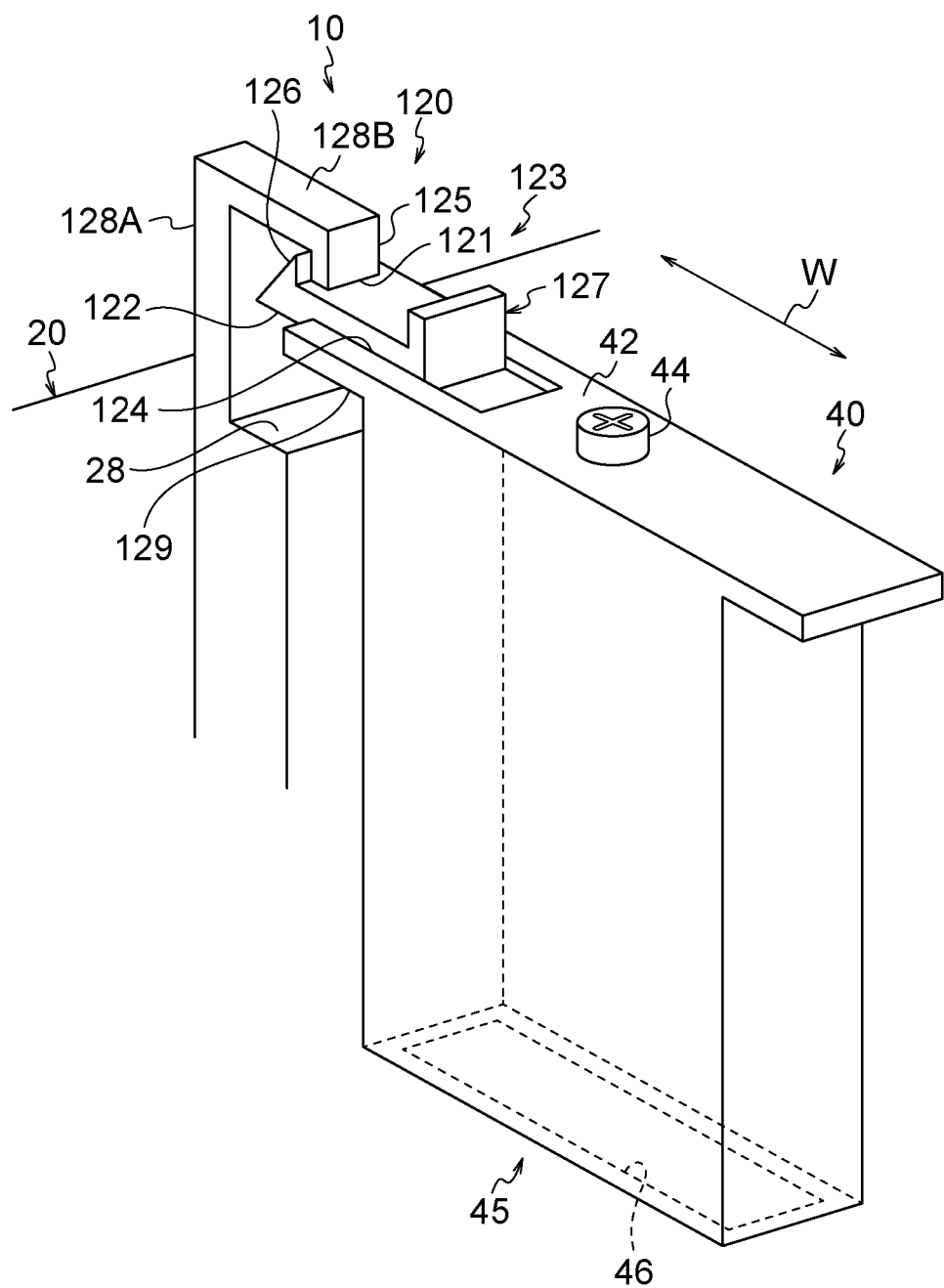
FIG. 15 is a view illustrating a ninth modification example of the electronic apparatus in FIG. 1.

In a ninth modification example illustrated in FIG. 15, a fixing mechanism 120 is used for the above embodiment. The fixing mechanism 120 is an example of "a fixing portion that fixes the dummy unit to the liquid immersion tank". As an example, the fixing mechanism 120 is provided only on one side of the dummy unit 40 in the lateral width direction (direction of the arrow W), but the fixing mechanisms 120 may be provided on both sides of the dummy unit 40 in the lateral width direction.

The fixing mechanism 120 includes an abutting portion 121, an abutting target portion 122, and a releasing mechanism 123. A vertical wall 128A extending upward is formed in one fixing portion 28 of the liquid immersion tank 20, and at the upper end portion of the vertical wall 128A, an extending portion 128B extending toward the inner side in the lateral width direction of the dummy unit 40 is formed. An engaging portion 125 in a protruding shape (to be described later) is formed at the tip end portion of the extending portion 128B, and a tip end surface (lower end surface) of the engaging portion 125 is formed as the abutting portion 121.

The releasing mechanism 123 enables release of the restricted state of the abutting portion 121 and the abutting target portion 122 as described later and includes a guide groove 124, the engaging portion 125, the engaging target portion 126, and a slide member 127. At the tip end of the ceiling portion 42 of the dummy unit 40, an extending portion 129 extending outward in the lateral width direction of the dummy unit 40 is formed, the guide groove 124 is an example of a "supporting portion", which is formed over the extending portion 129 and the ceiling portion 42 and is open to the upper side.

The slide member 127 is an example of a "movable member" and is supported to be slidable in the lateral width direction of the dummy unit 40 by the guide groove 124. The abutting target portion 122 is formed at the tip end portion of the slide member 127. In accordance with the sliding of the slide member 127, the abutting target portion 122 is movable to a restricting position opposing the abutting portion 121 from the lower side of the abutting portion 121 and a restriction releasing position shifted with respect to the abutting portion 121 in the lateral width direction (horizontal direction) of the dummy unit 40.

As described above, the engaging portion 125 is formed in a protruding shape protruding downward from the tip end portion of the extending portion 128B. The engaging target portion 126 is formed at the tip end portion of the abutting target portion 122 and is formed in a protruding shape protruding upward. The engaging target portion 126 is engaged with the engaging portion 125 in a case where the abutting target portion 122 abuts against the abutting portion 121 at the restricting position. In a case where the dummy unit 40 moves downward from a state where the abutting target portion 122 abuts against the abutting portion 121 at the restricting position, the engaging target portion 126 is positioned below the engaging portion 125, whereby the engaged state with the engaging portion 125 is released.

Figure 16:
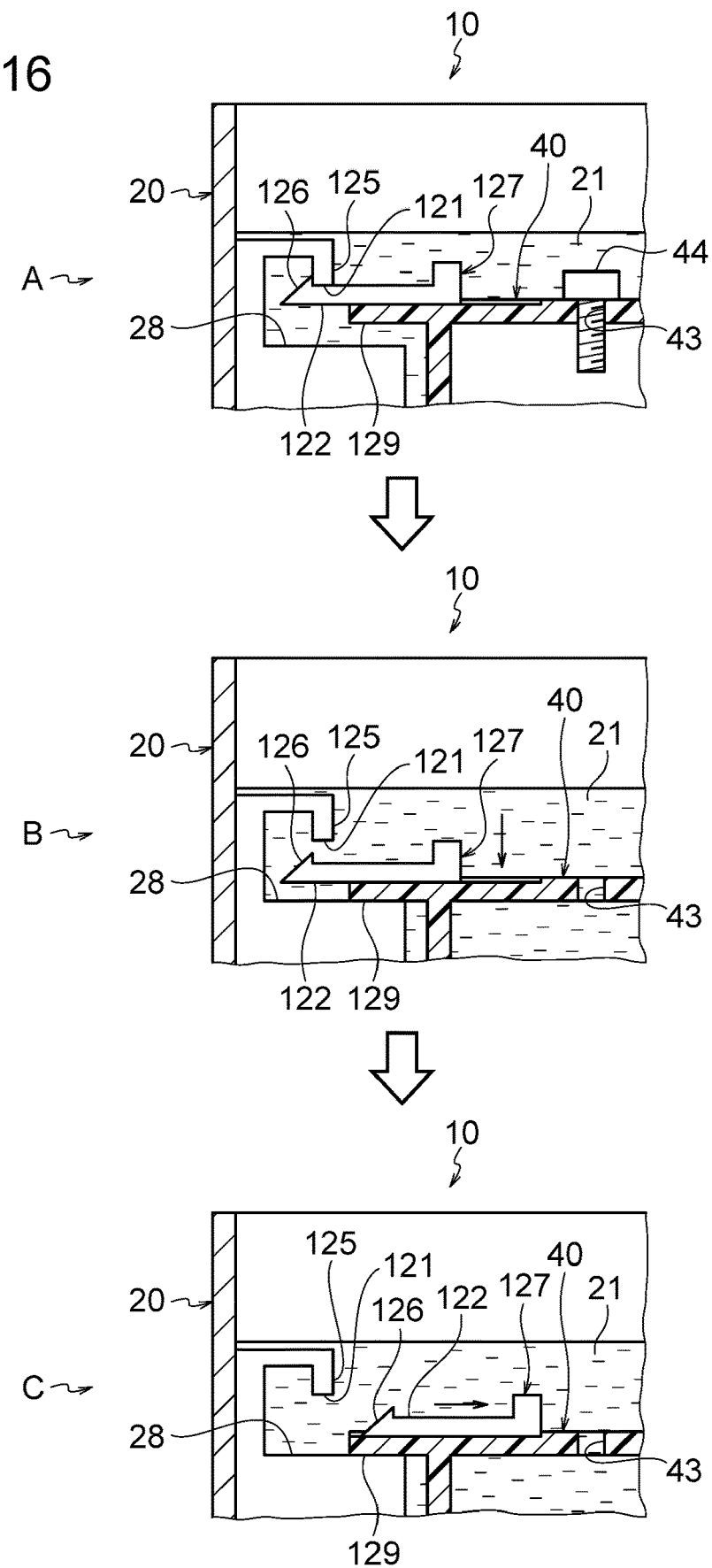
FIG. 16 is a view for describing an operation of the fixing mechanism in FIG. 15.

In this ninth modification example, as illustrated in the state A in FIG. 16, in a state where the dummy unit 40 is stored in the liquid immersion tank 20, the slide member 127 is slid, and the abutting target portion 122 formed on the slide member 127 is positioned at the restricting position. When the abutting target portion 122 is positioned at the restricting position, the abutting target portion 122 is positioned under the abutting portion 121 provided in the liquid immersion tank 20 and faces the abutting portion 121.

In this state, buoyancy is generated in the dummy unit 40 by the air filled in the dummy unit 40, and the dummy unit 40 floats, whereby the abutting target portion 122 abuts against the abutting portion 121 from the lower side. At this time, the engaging portion 125 and the engaging target portion 126 are engaged, and the sliding of the slide member 127 is restricted.

As described above, according to the ninth modification example, in a state where the dummy unit 40 is stored in the liquid immersion tank 20, the abutting target portion 122 may be abutted against the abutting portion 121 from the lower side by sliding the slide member 127 and positioning the abutting target portion 122 at the restricting position. As a result, since movement (floating) of the dummy unit 40 to the upper side may be restricted, for example, the workability at the time of fixing the dummy unit 40 may be improved as compared with a case where the dummy unit 40 is fixed to the liquid immersion tank 20 with screws while pressing the dummy unit 40.

On the other hand, as illustrated in the state B of FIG. 16, when the screw 44 is removed from the screw hole 43 to open the screw hole 43, the air inside the dummy unit 40 is discharged through the screw hole 43. As the air in the dummy unit 40 is discharged, the refrigerant 21 flows into the dummy unit 40 through the opening port 46 (see FIG. 15), and the buoyancy of the dummy unit 40 decreases.

When the buoyancy of the dummy unit 40 becomes smaller than the gravity applied to the dummy unit 40, the dummy unit 40 itself moves downward. The abutting target portion 122 descends integrally with the dummy unit 40 and the engaging target portion 126 is positioned below the engaging portion 125, whereby the engaged state of the engaging portion 125 and the engaging target portion 126 is released. In this state, the slide member 127 may be slid so that the abutting target portion 122 is shifted with respect to the abutting portion 121 in the horizontal direction.

Subsequently, as illustrated in the state C of FIG. 16, when the slide member 127 is slid to position the abutting target portion 122 at the restriction releasing position, the abutting target portion 122 is shifted with respect to the abutting portion 121 in the horizontal direction. As described above, when the abutting target portion 122 is shifted with respect to the abutting portion 121 in the horizontal direction, the dummy unit 40 may be taken out from the liquid immersion tank 20.

Thus, according to the ninth modification example, when taking out the dummy unit 40 from the liquid immersion tank 20, it is mandatory to slide the slide member 127 to position the abutting target portion 122 at the restriction releasing position. In order to position the abutting target portion 122 at the restriction releasing position, it is mandatory to move the dummy unit 40 downward to release the engaged state between the engaging portion 125 and the engaging target portion 126.

As a result, the order of operations may be defined so that the screw 44 is removed from the screw hole 43, the air in the dummy unit 40 is discharged, and then the slide member 127 is slid. Therefore, when taking out the dummy unit 40 from the liquid immersion tank 20, it is possible to suppress the slide member 127 from being slid prior to discharging the air in the dummy unit 40 and to more effectively suppressing the rapid floatation of the dummy unit 40.

The releasing mechanism 123 for releasing the restricted state of the abutting portion 121 and the abutting target portion 122 is a mechanical structure having the slide member 127, the guide groove 124, the engaging portion 125, and the engaging target portion 126. Therefore, for example, the structure may be simplified and reduced in weight as compared with a case where an electrical structure is used for the releasing mechanism 123.

The fixing mechanism 120 of the ninth modification example may be applied to the above-described first to seventh modification examples.

Tenth Modification Example

Figure 17:
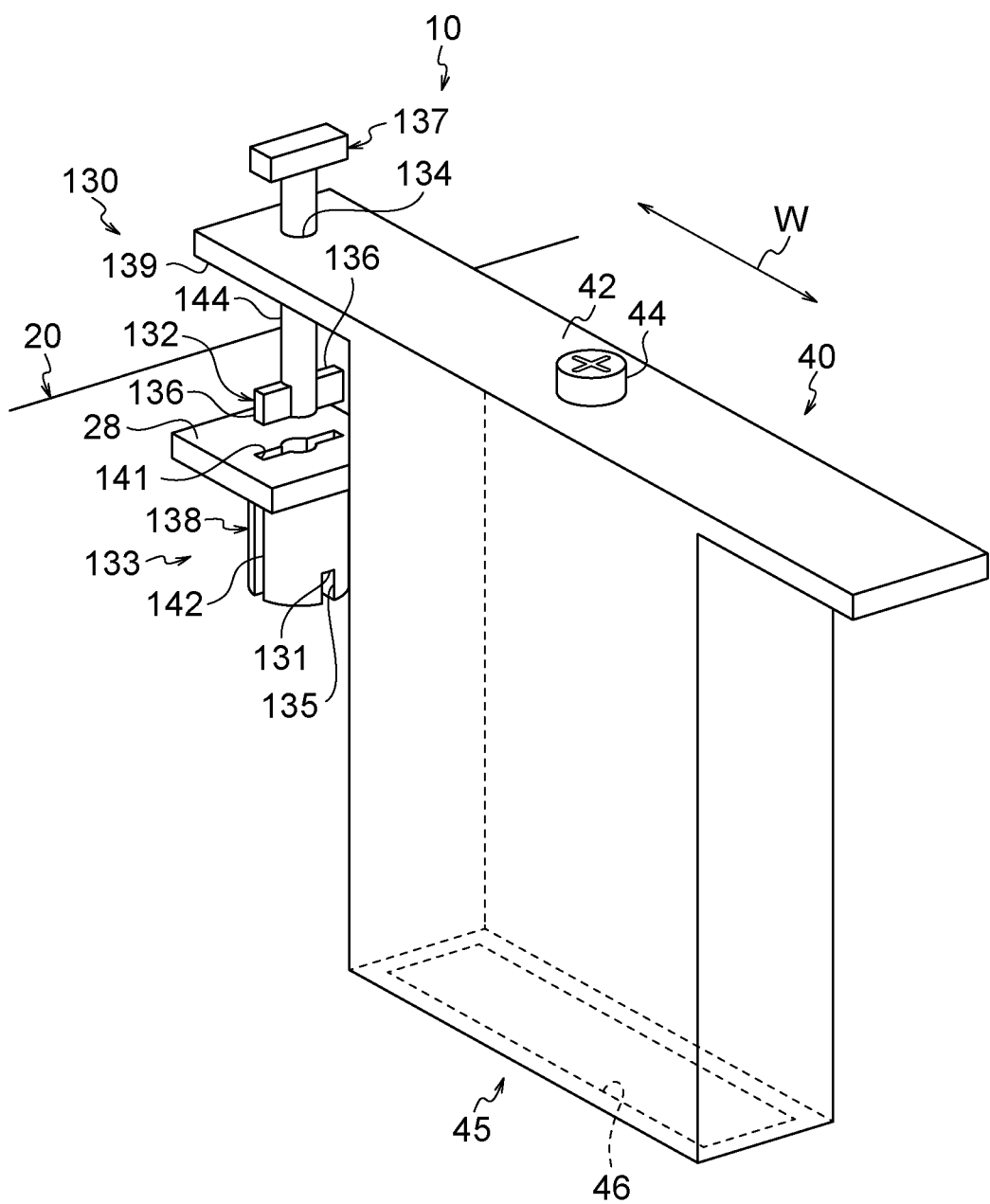
FIG. 17 is a view illustrating a tenth modification example of the electronic apparatus in FIG. 1.

In a tenth modification example illustrated in FIG. 17, a fixing mechanism 130 is used for the above embodiment. The fixing mechanism 130 is an example of "a fixing portion that fixes the dummy unit to the liquid immersion tank". As an example, the fixing mechanism 130 is provided only on one side of the dummy unit 40 in the lateral width direction (direction of the arrow W), but the fixing mechanisms 130 may be provided on both sides of the dummy unit 40 in the lateral width direction.

The fixing mechanism 130 includes a lever member 137 and a restricting member 138. One fixing portion 28 of the liquid immersion tank 20 is formed in a plate shape extending in the horizontal direction, and the restricting member 138 is provided on the lower surface of the fixing portion 28. The restricting member 138 is formed in a substantially columnar (cylindrical) shape. A through hole 141 penetrating in the vertical direction of the liquid immersion tank 20 is formed in the fixing portion 28. The through hole 141 is formed in a long hole shape into which the abutting target portion 132 formed by a pair of engaging target portions 136 to be described later may be inserted.

A communicating groove 142 having the same sectional shape as the through hole 141 in the restricting member 138. The communicating groove 142 is formed at a position aligned with the through hole 141 and extends in the vertical direction of the liquid immersion tank 20 and communicates with the through hole 141. A groove-shaped engaging portion 135 that opens downward is formed in the restricting member 138. For example, the engaging portion 135 is formed at a position shifted by 90 degrees with respect to the communicating groove 142 in the circumferential direction of the restricting member 138. The restricting member 138 has a pair of engaging portions 135 formed corresponding to the pair of engaging target portions 136. The top surface of the pair of engaging portions 135 is formed as an abutting portion 131.

The lever member 137 has an abutting target portion 132 and a rod 144. At the end portion of the ceiling portion 42 of the dummy unit 40, an extending portion 139 extending outward in the lateral width direction of the dummy unit 40 is formed, and a supporting hole 134 penetrating in the vertical direction of the dummy unit 40 is formed in the extending portion 139. The supporting hole 134 is an example of a "supporting portion".

The rod 144 is formed in a bar shape extending in the vertical direction of the dummy unit 40. The lever member 137 is rotatable around the axis of the rod 144 as the rod 144 is inserted into the supporting hole 134. The lever member 137 is fixed to the dummy unit 40 in the axial direction of the rod 144.

The abutting target portion 132 is provided at the lower end of the lever member 137. The abutting target portion 132 is formed by the pair of engaging target portions 136. The pair of engaging target portions 136 are formed in a protruding shape protruding in the horizontal direction. The abutting target portion 132 formed by the pair of engaging target portions 136 is rotatable around the axis of the rod 144 together with the lever member 137 by being integrally formed with the lever member 137.

As will be described in detail later, in a case where the dummy unit 40 moves downward in a state where the abutting target portion 132 is inserted in the through hole 141 and the communicating groove 142, the extending portion 139 abuts against the fixing portion 28 from the upper side. In this way, in a state in which the extending portion 139 is in contact with the fixing portion 28 from the upper side, the abutting target portion 132 is positioned on the lower side of the restricting member 138.

When the lever member 137 is rotated and the abutting target portion 132 is at a position corresponding to the groove-shaped engaging portion 135, the position of the abutting target portion 132 corresponds to the restricting position where the abutting target portion 132 faces the abutting portion 131 from the lower side of the abutting portion 131. When the lever member 137 is rotated and the abutting target portion 132 is at the position corresponding to the communicating groove 142, the position of the abutting target portion 132 corresponds to the restriction releasing position where the abutting target portion 132 is shifted with respect to the abutting portion 131 in the horizontal direction.

The abutting target portion 132 is movable to the restricting position and the restricted position in accordance with the rotation of the lever member 137 around the axis. The lever member 137, the engaging portion 135, and the engaging target portion 136 described above form a releasing mechanism 133 for releasing the restricted state of the abutting portion 131 and the abutting target portion 132.

Figure 18:
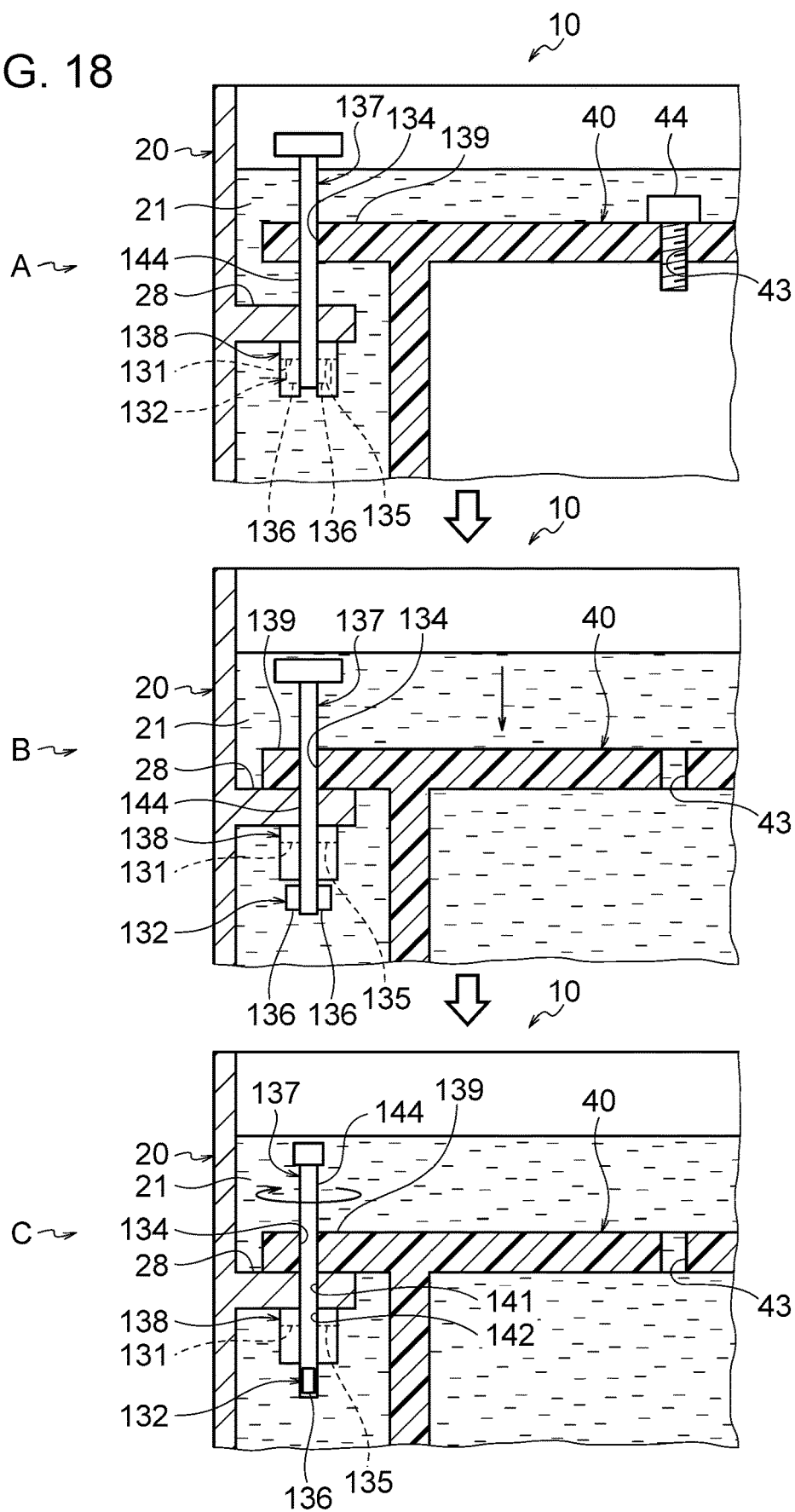
FIG. 18 is a view for describing an operation of the fixing mechanism in FIG. 17.

In the tenth modification example, as illustrated in the state A in FIG. 18, in a state where the dummy unit 40 is stored in the liquid immersion tank 20, the lever member 137 is rotated and the abutting target portion 132 is positioned at the restricting position. When the abutting target portion 132 is positioned at the restricting position, the abutting target portion 132 is positioned below the abutting portion 131 formed on the top surface of the groove-shaped engaging portion 135 and faces the abutting portion 131.

In this state, buoyancy is generated in the dummy unit 40 by the air filled in the dummy unit 40, and the dummy unit 40 floats, whereby the abutting target portion 132 abuts against the abutting portion 131 from the lower side. As a result, the upward movement (floating) of the dummy unit 40 is restricted. At this time, the engaging portion 135 and the engaging target portion 136 are engaged, and the rotation of the lever member 137 is restricted.

As described above, according to the tenth modification example, in a state where the dummy unit 40 is stored in the liquid immersion tank 20, the abutting target portion 132 may be abutted against the abutting portion 131 from the lower side by rotating the lever member 137 and positioning the abutting target portion 132 at the restricting position. As a result, since movement (floating) of the dummy unit 40 to the upper side may be restricted, for example, the workability at the time of fixing the dummy unit 40 may be improved as compared with a case where the dummy unit 40 is fixed to the liquid immersion tank 20 with screws while pressing the dummy unit 40.

On the other hand, as illustrated in the state B of FIG. 18, when the screw 44 is removed from the screw hole 43 to open the screw hole 43, the air inside the dummy unit 40 is discharged through the screw hole 43. As the air in the dummy unit 40 is discharged, the refrigerant 21 flows into the dummy unit 40 through the opening port 46 (see FIG. 17), and the buoyancy of the dummy unit 40 decreases.

When the buoyancy of the dummy unit 40 becomes smaller than the gravity applied to the dummy unit 40, the dummy unit 40 itself moves downward. The lever member 137 descends integrally with the dummy unit 40 and the engaging target portion 136 is positioned below the engaging portion 135, whereby the engaged state of the engaging portion 135 and the engaging target portion 136 is released. In this state, it is possible to rotate the lever member 137 so that the abutting target portion 132 is shifted with respect to the abutting portion 131 in the horizontal direction.

Subsequently, as illustrated in the state C of FIG. 16, when the lever member 137 is rotated to position the abutting target portion 132 at the restriction releasing position, the abutting target portion 132 is positioned at a position corresponding to the communicating groove 142 and the through hole 141. When the abutting target portion 132 is positioned at a position corresponding to the communicating groove 142 and the through hole 141 as described above, the dummy unit 40 may be taken out from the liquid immersion tank 20.

As described above, according to the tenth modification example, when taking out the dummy unit 40 from the liquid immersion tank 20, it is mandatory to rotate the lever member 137 to position the abutting target portion 132 at the restriction releasing position. In order to position the abutting target portion 132 at the restriction releasing position, it is mandatory to move the dummy unit 40 downward to release the engaged state between the engaging portion 135 and the engaging target portion 136.

As a result, the order of operations may be defined so that the screw 44 is removed from the screw hole 43, the air in the dummy unit 40 is discharged, and then the lever member 137 is rotated. Therefore, when taking out the dummy unit 40 from the liquid immersion tank 20, it is possible to suppress the lever member 137 from being rotated prior to discharging the air in the dummy unit 40 and to more effectively suppressing the rapid flotation of the dummy unit 40.

The releasing mechanism 133 for releasing the restricted state of the abutting portion 131 and the abutting target portion 132 is a mechanical structure having the lever member 137, the supporting hole 134, the engaging portion 135, and the engaging target portion 136. Therefore, for example, the structure may be simplified and reduced in weight as compared with a case where an electrical structure is used for the releasing mechanism 133.

The fixing mechanism 130 of the tenth modification example may be applied to the above-described first to seventh modification examples.

Eleventh Modification Example

Figure 19:
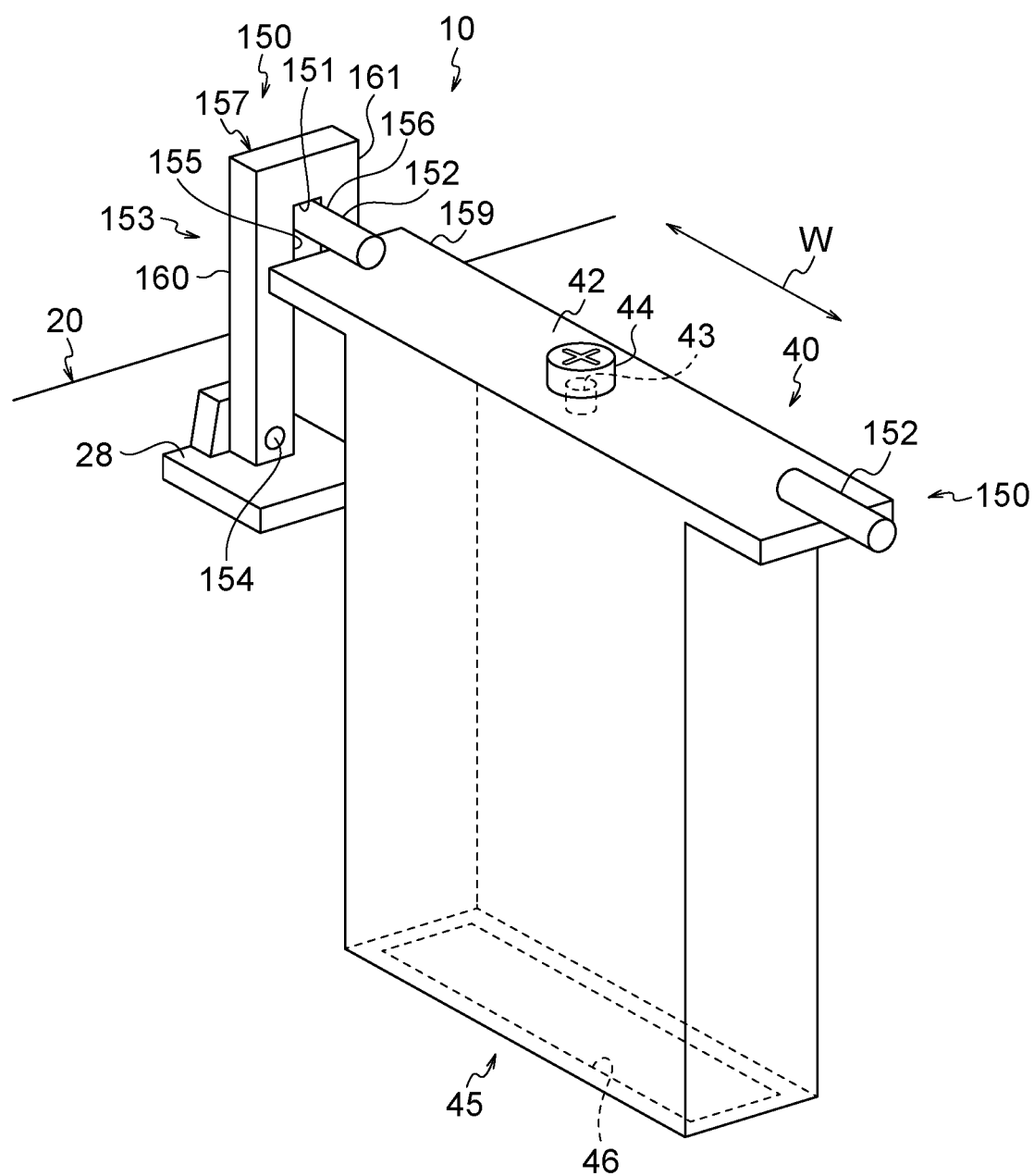
FIG. 19 is a view illustrating an eleventh modification example of the electronic apparatus in FIG. 1.

In an eleventh modification example illustrated in FIG. 19, a fixing mechanism 150 is used for the above embodiment. The fixing mechanism 150 is an example of "a fixing portion that fixes the dummy unit to the liquid immersion tank". The fixing mechanism 150 is preferably provided on both sides of the dummy unit 40 in the lateral width direction (direction of the arrow W). In FIG. 13, one fixing mechanism 150 is illustrated in the entirety thereof, but for the sake of convenience, only a part of the other fixing mechanism 150 is illustrated.

The pair of fixing mechanisms 150 are symmetrically formed in the lateral width direction of the dummy unit 40. Each fixing mechanism 150 has a lever member 157 and an abutting target portion 152. A rotating shaft 154 extending in the lateral direction of the dummy unit 40 is provided on one of the fixing portions 28 of the liquid immersion tank 20. The rotating shaft 154 is an example of a "supporting portion". The lever member 157 extends upward with respect to the rotating shaft 154, and the lower end portion of the lever member 157 is rotatably supported by the rotating shaft 154. The lever member 157 is rotatable between an upright position along the vertical direction and a tilted position that is tilted with respect to the vertical direction by being supported by the rotating shaft 154.

The upper end portion of the lever member 157 has a hook shape. That is, on the upper end portion of the lever member 157, a groove-shaped engaging portion 155 opening downward is formed. The top surface of the engaging portion 155 is formed as an abutting portion 151. A base portion 160 of the lever member 157 extends from the rotating shaft 154 toward the upper side of the lever member 157, and a tip end portion 161 of the lever member 157 extends from the abutting portion 151 toward the lower side of the lever member 157.

When the lever member 157 is at the upright position, the abutting portion 151 is positioned at a restricting position opposing the abutting target portion 152 from the upper side of the abutting target portion 152 to be described later. When the lever member 157 is in the tilted position, the abutting portion 151 is positioned at the restriction releasing position shifted with respect to the abutting target portion 152 in the horizontal direction. That is, the abutting portion 151 is movable to the restricting position and the restriction releasing position in accordance with the rotation of the lever member 157.

At the end of the ceiling portion 42 of the dummy unit 40, an extending portion 159 extending outward in the lateral width direction of the dummy unit 40 is formed, and the abutting target portion 152 is provided in the extending portion 159. The abutting target portion 152 is formed in a pin shape extending outward from the tip end portion of the extending portion 159 in the lateral width direction of the dummy unit 40. The tip end portion of the abutting target portion 152 is formed as an engaging target portion 156 to be engaged with the engaging portion 155. The rotating shaft 154, the engaging portion 155, and the engaging target portion 156 described above form a releasing mechanism 153 for releasing the restricted state of the abutting portion 151 and the abutting target portion 152.

Figure 20:
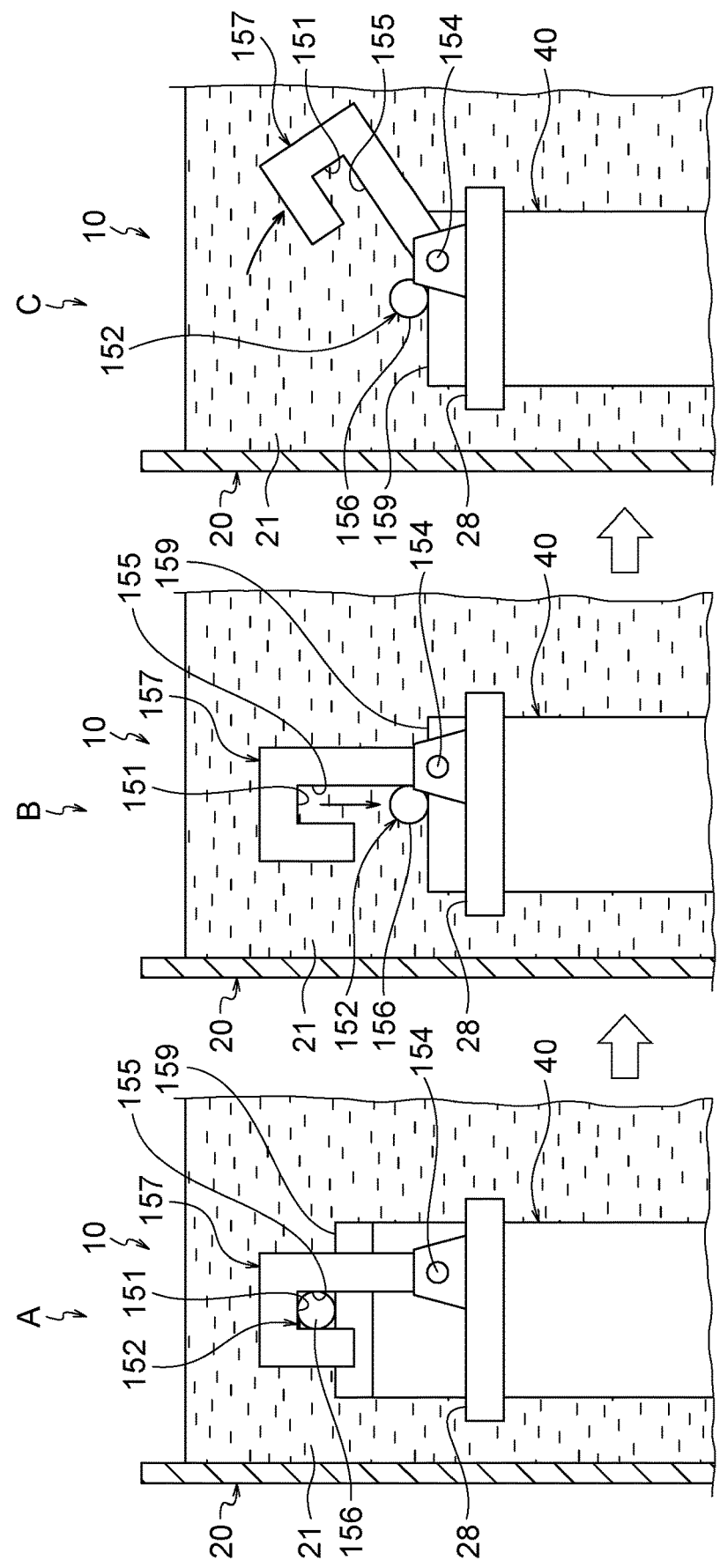
FIG. 20 is a view for describing an operation of the fixing mechanism in FIG. 19.

In the eleventh modification example, as illustrated in the state A in FIG. 20, in a state where the dummy unit 40 is stored in the liquid immersion tank 20, the lever member 157 provided in the liquid immersion tank 20 is positioned at the upright position. When the lever member 157 is positioned at the upright position, the abutting portion 151 is positioned above the abutting target portion 152 provided in the dummy unit 40 and faces the abutting target portion 152.

In this state, buoyancy is generated in the dummy unit 40 by the air filled in the dummy unit 40, and the dummy unit 40 floats, whereby the abutting target portion 152 abuts against the abutting portion 151 from the lower side. As a result, the upward movement (floating) of the dummy unit 40 is restricted. At this time, the engaging portion 155 and the engaging target portion 156 are engaged, and the rotation of the lever member 157 is restricted.

As described above, according to the eleventh modification example, in a state where the dummy unit 40 is stored in the liquid immersion tank 20, the abutting portion 151 may be abutted against the abutting target portion 152 from the upper side by rotating the lever member 157 and positioning the abutting portion 151 at the restricting position. As a result, since movement (floating) of the dummy unit 40 to the upper side may be restricted, for example, the workability at the time of fixing the dummy unit 40 may be improved as compared with a case where the dummy unit 40 is fixed to the liquid immersion tank 20 with screws while pressing the dummy unit 40.

On the other hand, as illustrated in the state B of FIG. 20, when the screw 44 is removed from the screw hole 43 (see FIG. 19 for both) to open the screw hole 43, the air inside the dummy unit 40 is discharged through the screw hole 43. As the air in the dummy unit 40 is discharged, the refrigerant 21 flows into the dummy unit 40 through the opening port 46 (see FIG. 19), and the buoyancy of the dummy unit 40 decreases.

When the buoyancy of the dummy unit 40 becomes smaller than the gravity applied to the dummy unit 40, the dummy unit 40 itself moves downward. The abutting target portion 152 descends integrally with the dummy unit 40 and the engaging target portion 156 is positioned below the engaging portion 155, whereby the engaged state of the engaging portion 155 and the engaging target portion 156 is released. In this state, the lever member 157 may be rotated. That is, it is possible to move the abutting portion 151 so that the lever member 157 is rotatable from the upright position to the tilted position, and in turn, the abutting portion 151 is shifted with respect to the abutting target portion 152 in the horizontal direction.

Subsequently, as illustrated in the state C of FIG. 20, when the lever member 157 is rotated and positioned at the tilted position, the abutting portion 151 is positioned at the restriction releasing position. When the abutting portion 151 is positioned at the restriction releasing position as described above, since the abutting portion 151 is shift in the horizontal direction with respect to the abutting target portion 152, the dummy unit 40 may be taken out from the liquid immersion tank 20.

As described above, according to the eleventh modification example, when taking out the dummy unit 40 from the liquid immersion tank 20, it is mandatory to rotate the lever member 157 to position the abutting portion 151 at the restriction releasing position. In order to position the abutting portion 151 at the restriction releasing position, it is mandatory to move the dummy unit 40 downward to release the engaged state between the engaging portion 155 and the engaging target portion 156.

As a result, the order of operations may be defined so that the screw 44 is removed from the screw hole 43, the air in the dummy unit 40 is discharged, and then the lever member 157 is rotated. Therefore, when taking out the dummy unit 40 from the liquid immersion tank 20, it is possible to suppress the lever member 157 from being rotated prior to discharging the air in the dummy unit 40 and to more effectively suppressing the rapid flotation of the dummy unit 40.

The releasing mechanism 153 for releasing the restricted state of the abutting portion 151 and the abutting target portion 152 is a mechanical structure having the lever member 157, the rotating shaft 154, the engaging portion 155, and the engaging target portion 156. Therefore, for example, the structure may be simplified and reduced in weight as compared with a case where an electrical structure is used for the releasing mechanism 153.

The fixing mechanism 150 of the eleventh modification example may be applied to the above-described first to seventh modification examples.

Twelfth Modification Example

Figure 21:
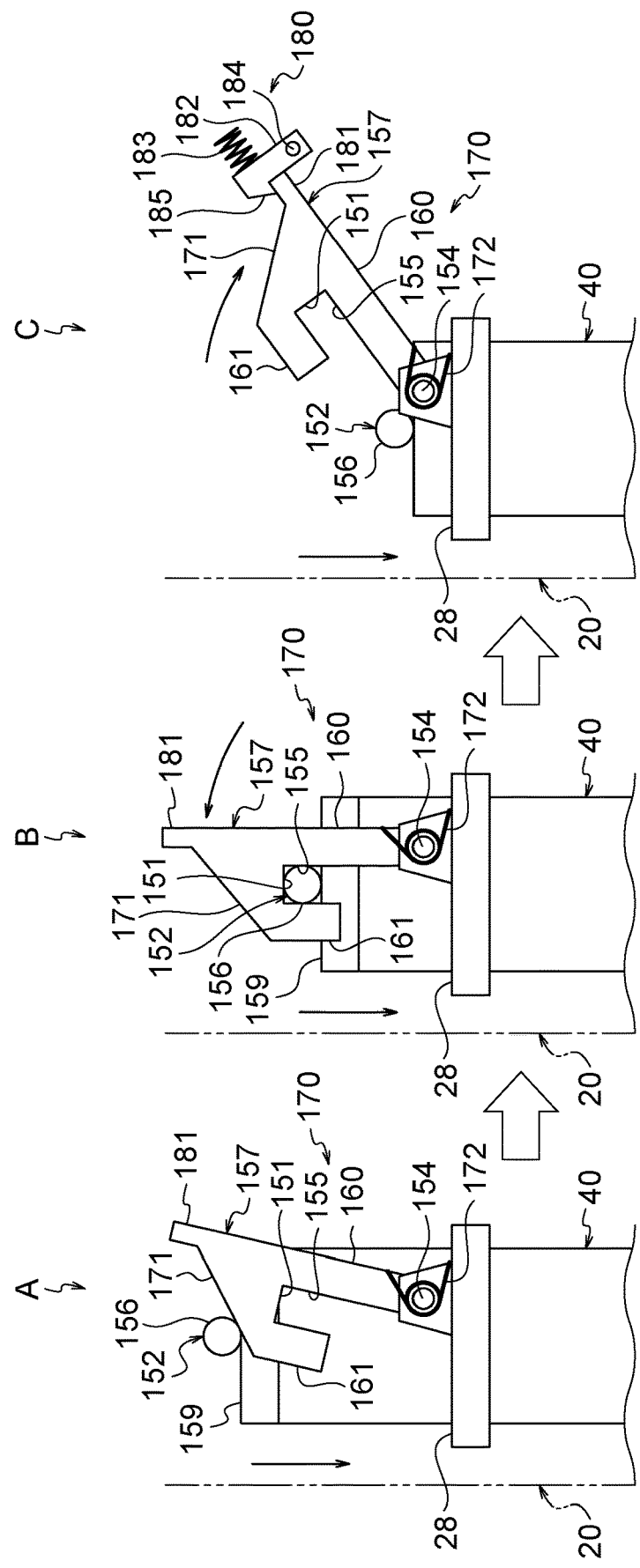
FIG. 21 is a view illustrating a twelfth modification example of the electronic apparatus in FIG. 1.

In a twelfth modification example illustrated in FIG. 21, an interlocking mechanism 170 is provided in the eleventh modification example described above. The interlocking mechanism 170 brings the abutting portion 151 and the abutting target portion 152 into an opposing state as the dummy unit 40 is stored in the liquid immersion tank 20. That is, the interlocking mechanism 170 includes a tilted surface 171 formed at the upper end portion of the lever member 157 and a torsion spring 172 provided on the rotating shaft 154.

The tilted surface 171 is tilted with respect to the vertical direction of the lever member 157 so as to extend from the base portion 160 side of the lever member 157 toward the tip end portion 161 from the upper end side to the lower end side of the lever member 157. The torsion spring 172 is provided on the rotating shaft 154 and urges the lever member 157 to the upright position.

In the twelfth modification, as illustrated in the state A in FIG. 21, as the dummy unit 40 is lowered into the liquid immersion tank 20, the abutting target portion 152 of the dummy unit 40 is in sliding contact with the tilted surface 171. As a result, a rotational force from the upright position toward the tilted position acts on the lever member 157, and the lever member 157 rotates.

As illustrated in the state B of FIG. 21, when the abutting target portion 152 goes over the tilted surface 171 and the tip end portion 161, the urging force of the torsion spring 172 causes the lever member 157 to return to the upright position. The abutting target portion 152 faces the abutting portion 151.

Thus, according to the twelfth modification example, since the interlocking mechanism 170 is used, it is possible to bring the abutting portion 151 and the abutting target portion 152 into an opposing state as the dummy unit 40 is stored in the liquid immersion tank 20.

In this state, buoyancy is generated in the dummy unit 40 by the air filled in the dummy unit 40, and the dummy unit 40 floats, whereby the abutting target portion 152 abuts against the abutting portion 151 from the lower side. As a result, the upward movement (floating) of the dummy unit 40 is restricted. At this time, the engaging portion 155 and the engaging target portion 156 are engaged, and the rotation of the lever member 157 is restricted.

As illustrated in the state C of FIG. 21, a holding mechanism 180 is used in the twelfth modification example. The holding mechanism 180 includes an engaging portion 181, a holding portion 182, and a coil spring 183. The engaging portion 181 is formed in a protruding shape protruding upward from the upper end portion of the lever member 157. The holding portion 182 is rotatably supported by a rotating shaft 184 extending in the lateral width direction of the dummy unit 40. An engaging target portion 185 in a protruding shape is formed at the tip end portion of the holding portion 182. The coil spring 183 urges the holding portion 182 toward the lever member 157 in the tilted position.

In this twelfth modification example, when an operator positions the lever member 157 to the tilted position by hand, the lever member 157 is held in the tilted position by engaging the engaging target portion 185 of the holding portion 182 with the engaging portion 181. Therefore, when removing the dummy unit 40 from the liquid immersion tank 20, the operator does not have to hold the lever member 157 at the tilted position by hand, it is possible to improve workability when taking out the dummy unit 40 from the liquid immersion tank 20.

In the twelfth modification example, when the holding portion 182 is rotated against the urging force of the coil spring 183, the engaged state between the engaging portion 181 of the lever member 157 and the engaging target portion 185 of the holding portion 182 is released. The lever member 157 may be returned to the upright position by the urging force of the torsion spring 172. Therefore, it is possible to improve workability when returning the lever member 157 to the upright position.

An interlocking mechanism having the same function as the interlocking mechanism 170 of the twelfth modification example may be applied to the above eighth to tenth modification examples.

Thirteenth Modification Example

Figure 22:
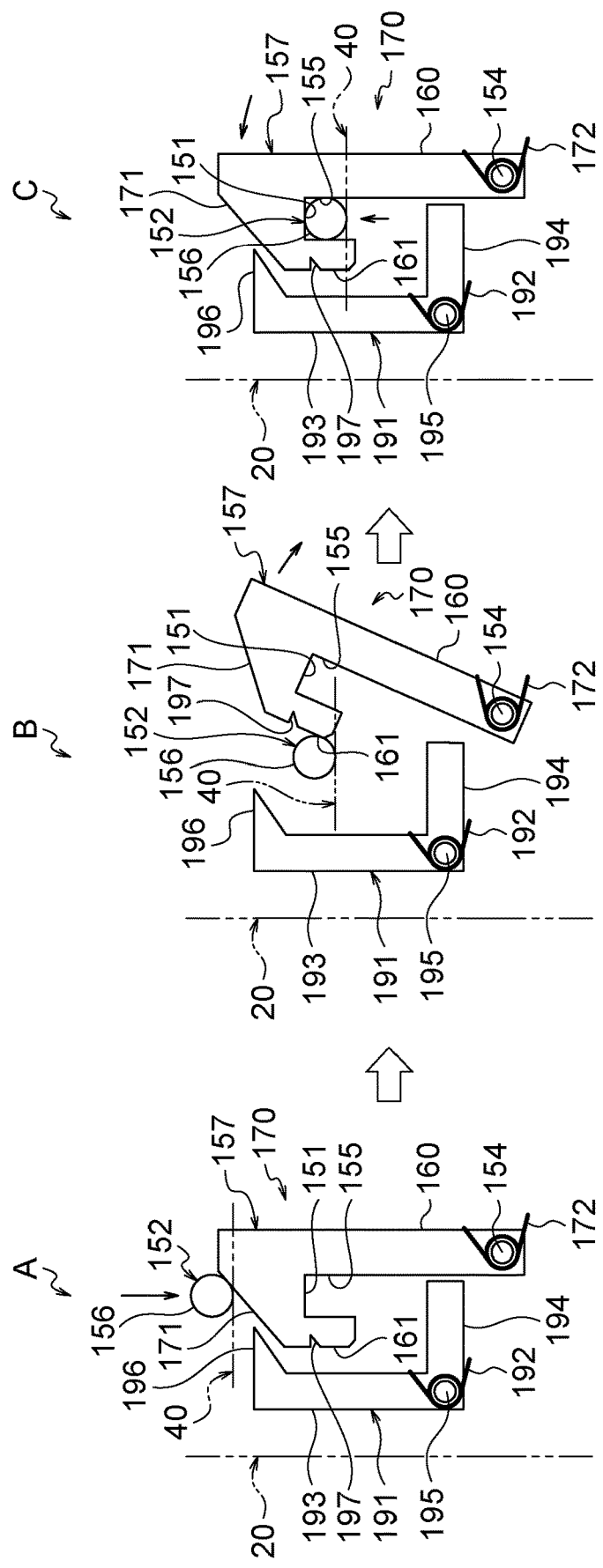
FIG. 22 is a view illustrating a thirteenth modification example of the electronic apparatus in FIG. 1.

In a thirteenth modification example illustrated in FIGS. 22 and 23, the following interlocking function is added to the interlocking mechanism 170 in the twelfth modification described above. That is, the interlocking mechanism 170 includes an arm member 191 and a torsion spring 192.

The arm member 191 is provided side by side with the lever member 157. The arm member 191 has a first arm portion 193 and a second arm portion 194. The first arm portion 193 is provided along the tip end portion 161 of the lever member 157 and extends in the vertical direction of the lever member 157. The second arm portion 194 extends from the lower end portion of the first arm portion 193 toward the base portion 160 side of the lever member 157. The arm member 191 is rotatably supported by a rotating shaft 195 parallel to the rotating shaft 154 of the lever member 157.

The arm member 191 is rotatable between an upright position where the first arm portion 193 extends in the vertical direction and a tilt position where the first arm portion 193 is inclined toward the lever member 157. The torsion spring 192 is provided on the rotating shaft 195 and urges the arm member 191 to the upright position.

In the interlocking mechanism 170 according to the thirteenth modification example, a protruding portion 196 is formed at the upper end portion of the first arm portion 193, and a groove portion 197 is formed at the tip end portion 161 of the lever member 157. The protruding portion 196 protrudes toward the lever member 157, and the groove portion 197 is open to the side of the arm member 191.

In the thirteenth modification, as illustrated in the state A in FIG. 22, as the dummy unit 40 is lowered into the liquid immersion tank 20, the abutting target portion 152 of the dummy unit 40 is in sliding contact with the tilted surface 171. As a result, a rotational force from the upright position toward the tilted position acts on the lever member 157, and the lever member 157 rotates.

As illustrated from the state A to the state C in FIG. 22, when the abutting target portion 152 goes over the tilted surface 171 and the tip end portion 161, the urging force of the torsion spring 172 causes the lever member 157 to return to the upright position. The abutting target portion 152 faces the abutting portion 151.

Thus, according to the thirteenth modification example, the lever member 157 may be rotated as the dummy unit 40 is stored in the liquid immersion tank 20 by the interlocking mechanism 170. As a result, the abutting portion 151 and the abutting target portion 152 may be brought into an opposing state.

In this state, buoyancy is generated in the dummy unit 40 by the air filled in the dummy unit 40, and the dummy unit 40 floats, whereby the abutting target portion 152 abuts against the abutting portion 151 from the lower side. As a result, the upward movement (floating) of the dummy unit 40 is restricted. At this time, the engaging portion 155 and the engaging target portion 156 are engaged, and the rotation of the lever member 157 is restricted.

On the other hand, as illustrated in the state D of FIG. 23, when the dummy unit 40 moves downward as the air in the dummy unit 40 is discharged, the abutting target portion 152 descends integrally with the dummy unit 40. The engaging target portion 156 is positioned below the engaging portion 155, and the engaged state of the engaging portion 155 and the engaging target portion 156 is released.

As illustrated in the state E of FIG. 23, when the dummy unit 40 further moves downward, the abutting target portion 152 of the dummy unit 40 pushes the second arm portion 194 downward. As a result, the arm member 191 is tilted, and the protruding portion 196 formed on the first arm portion 193 pushes the lever member 157, whereby the lever member 157 rotates. When the lever member 157 is positioned at the tilted position, the protruding portion 196 is engaged with the groove portion 197, and the lever member 157 is held at the tilted position. In this state, since the abutting portion 151 is shifted with respect to the abutting target portion 152 in the horizontal direction, the dummy unit 40 may be taken out from the liquid immersion tank 20.

Thus, according to the thirteenth modification example, when the dummy unit 40 moves downward, the interlocking mechanism 170 causes the lever member 157 to rotate, and the abutting portion 151 and the abutting target portion 152 are shifted in the horizontal direction. Therefore, when removing the dummy unit 40 from the liquid immersion tank 20, the operator does not have to rotate the lever member 157 at the tilted position by hand, it is possible to improve workability when taking out the dummy unit 40 from the liquid immersion tank 20.

Subsequently, as illustrated in the state F of FIG. 23, when the dummy unit 40 is taken out from the liquid immersion tank 20, when the dummy unit 40 is raised, the abutting target portion 152 of the dummy unit 40 interferes with the tip end portion 161 of the lever member 157. As a result, as the lever member 157 rotates, the engaged state between the protruding portion 196 and the groove portion 197 is released.

As illustrated in the state G of FIG. 23, when the engaged state between the protruding portion 196 and the groove portion 197 is released, the arm member 191 is returned to the upright position by the urging force of the torsion spring 192. At this time, the abutting portion 151 interferes with the tip end portion 161 of the lever member 157, whereby the lever member 157 is restricted to the tilted position.

As illustrated in the state H of FIG. 23, when the dummy unit 40 is further raised, the abutting target portion 152 passes between the arm member 191 and the lever member 157, and the dummy unit 40 is taken out from the liquid immersion tank 20. When the abutting target portion 152 passes between the arm member 191 and the lever member 157, the restricted state of the lever member 157 by the abutting target portion 152 is released and the lever member 157 is returned to the upright position by the urging force of the torsion spring 172.

Thus, according to the thirteenth modification example, when the dummy unit 40 is taken out from the liquid immersion tank 20, the interlocking mechanism 170 returns the lever member 157 to the upright position. Therefore, since the operator does not have to manually return the lever member 157 to the upright position, it is possible to improve the workability when taking out the dummy unit 40 from the liquid immersion tank 20.

An interlocking mechanism having the same function as the interlocking mechanism 170 of the thirteenth modification example may be applied to the above eighth to tenth modification examples.

One embodiment of the technology disclosed in the present application has been described above, but the technique disclosed in the present application is not limited to the above, and it goes without saying that various modifications may be made without departing from the scope of the disclosure in addition to the above.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic apparatus comprising:
   a liquid immersion tank that stores a refrigerant and has a plurality of slots therein;
   an electronic device stored in one slot of the plurality of slots;
   a dummy device stored in another slot of the plurality of slots and formed in a hollow shape, the dummy device having a ceiling portion and a bottom portion, the ceiling portion having a first hole and an opening and closing portion to open and close the first hole, and the bottom portion being open; and
   a fixing portion that fixes the dummy device to the liquid immersion tank.

2. The electronic apparatus according to claim 1, wherein the first hole is a screw hole, and
   the opening and closing portion is a screw screwed into the screw hole.

3. The electronic apparatus according to claim 1, wherein the ceiling portion has a screw hole as the first hole, and a second hole around the screw hole, and
   the opening and closing portion has a screw screwed into the screw hole, and a sealing member interposed between a head portion of the screw and the ceiling portion, the sealing member closing the second hole.

4. The electronic apparatus according to claim 3, wherein the ceiling portion has a plurality of pores as the second hole.

5. The electronic apparatus according to claim 1, wherein the opening and closing portion has a valve and a switching mechanism that switches the valve between an open state and a closed state.

6. The electronic apparatus according to claim 1, wherein the opening and closing portion has a plug and an urging member to urge the plug to a closed state.

7. The electronic apparatus according to claim 1, wherein the opening and closing portion is formed in an elastic plate shape and has a sheet member fixed to the ceiling portion, the sheet member opening and closing the first hole from the inside of the dummy device.

8. The electronic apparatus according to claim 1, wherein
the ceiling portion has a bulging portion that bulges toward an upper side of the dummy device,
the opening and closing portion is provided at an upper end of the bulging portion, and
in a state where the dummy device is stored in a slot of the plurality of slots in the liquid immersion tank, the upper end of the bulging portion is set to a height positioned higher than a liquid level when the refrigerant is filled in the liquid immersion tank.

9. The electronic apparatus according to claim 1, wherein the dummy device includes:
a case stored in the liquid immersion tank, the case having an accommodating portion that penetrates the dummy device in a vertical direction, and
a plurality of hollow units accommodated in the accommodating portion, each of the plurality of hollow units having the ceiling portion and the bottom portion.

10. The electronic apparatus according to claim 1, wherein the fixing portion includes:
an abutting portion provided in the liquid immersion tank;
an abutting target portion provided in the dummy device, the abutting target portion abutting against a lower side of the abutting portion in a state where the dummy device is stored in a slot of the plurality of slots in the liquid immersion tank; and
a releasing mechanism that allows the abutting portion to move relatively to the abutting target portion so that the abutting portion is shifted with respect to the abutting target portion in a horizontal direction in a case where the dummy device moves downward from a state in which the abutting target portion abuts against the lower side of the abutting portion.

11. The electronic apparatus according to claim 10, wherein the releasing mechanism includes:
a movable member that has the abutting portion,
a supporting portion that supports the movable member with respect to the liquid immersion tank so that the abutting portion is movable to a restricting position opposing an upper side of the abutting target portion and a restriction releasing position shifted with respect to the abutting target portion in the horizontal direction,
an engaging portion formed in the movable member, and
an engaging target portion that is engaged with the engaging portion in a case where the abutting portion abuts against the abutting target portion at the restricting position and is released from an engaged state with the engaging portion in a case where the dummy device moves downward from a state where the abutting portion abuts against the abutting target portion at the restricting position.

12. The electronic apparatus according to claim 10, wherein the releasing mechanism includes:
a movable member that has the abutting target portion,
a supporting portion that supports the movable member with respect to the dummy device so that the abutting target portion is movable to a restricting position opposing a lower side of the abutting portion and a restriction releasing position shifted with respect to the abutting portion in the horizontal direction,
an engaging target portion formed in the movable member, and
an engaging portion that is engaged with the engaging target portion in a case where the abutting target portion abuts against the abutting portion at the restricting position and is released from an engaged state with the engaging target portion in a case where the dummy device moves downward from a state where the abutting target portion abuts against the abutting portion at the restricting position.

13. The electronic apparatus according to claim 10, wherein the fixing portion further includes:
an interlocking mechanism that brings the abutting portion and the abutting target portion into an opposing state as the dummy device is stored in the slot of the plurality of slots in the liquid immersion tank.

14. The electronic apparatus according to claim 13,
wherein the interlocking mechanism brings the abutting portion and the abutting target portion into a state of being shifted in a horizontal direction as the dummy device moves downward in a state of being stored in the slot in the liquid immersion tank.

15. A dummy device comprising:
a fixed portion fixed to a liquid immersion tank that stores a refrigerant and has a plurality of slots therein, an electric device being stored in one slot of the plurality of slots, and the dummy device being stored in another slot of the plurality of slots;
a ceiling portion that has a first hole and an opening and closing portion to open and close the first hole; and
a bottom portion that is open,
wherein the dummy device is formed in a hollow shape.

* * * * *